(12) United States Patent
Hayakawa

(10) Patent No.: US 7,834,356 B2
(45) Date of Patent: Nov. 16, 2010

(54) SEMICONDUCTOR DEVICE AND METHOD OF FABRICATING THE SAME

(75) Inventor: Masahiko Hayakawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 597 days.

(21) Appl. No.: 11/806,132

(22) Filed: May 30, 2007

(65) Prior Publication Data

US 2007/0228374 A1 Oct. 4, 2007

Related U.S. Application Data

(62) Division of application No. 10/293,427, filed on Nov. 14, 2002, now Pat. No. 7,238,557.

(30) Foreign Application Priority Data

Nov. 14, 2001 (JP) ............................. 2001-349308

(51) Int. Cl.
*H01L 29/786* (2006.01)

(52) U.S. Cl. ............................. 257/66; 257/74; 257/75; 257/627; 257/E29.293

(58) Field of Classification Search .................. 257/66, 257/74, 75, 627, E29.273, E29.293; 438/161, 438/166

See application file for complete search history.

(56) References Cited

U.S. PATENT DOCUMENTS 4,569,894 A 2/1986 Saitoh et al.
4,697,331 A 10/1987 Boulitrop et al.

(Continued)

FOREIGN PATENT DOCUMENTS

JP 02-084773 3/1990

(Continued)

OTHER PUBLICATIONS

Ching-Wei Lin et al., *High-Performance Low-Temperature Poly-Si TFTs Crystallized by Excimer Laser Irradiation with Recessed-Channel Structure*, IEEE Electron Device Letters, vol. 22, No. 6, Jun. 1, 2001, pp. 269-271.

(Continued)

*Primary Examiner*—Mary Wilczewski
(74) *Attorney, Agent, or Firm*—Eric J. Robinson; Robinson Intellectual Property Law Office, P.C.

(57) ABSTRACT

To provide a thin film transistor having a high field effect mobility and a small variation in characteristics thereof, a second amorphous semiconductor layer patterned in a predetermined shape is formed on a first crystalline semiconductor layer 17 for constituting source and drain regions. By irradiating an irradiated region 21 of continuous wave laser beam while scanning along a channel length direction, the second amorphous semiconductor layer is crystallized to form a second crystalline semiconductor layer 22. The first crystalline semiconductor layer 17 is crystallized by selectively adding nickel and therefore, an orientation rate of {111} is increased. By irradiating laser beam, crystals of the second amorphous semiconductor layer grow by constituting a seed by the first crystalline semiconductor layer 17 oriented to {111} and therefore, a region 22a for constituting a channel forming region is also oriented highly to {111} and a direction of a crystal grain boundary becomes parallel with the channel length direction.

28 Claims, 27 Drawing Sheets

U.S. PATENT DOCUMENTS

| | | | |
|---|---|---|---|
| 5,037,766 A | 8/1991 | Wang | |
| 5,225,371 A | 7/1993 | Sexton et al. | |
| 5,313,075 A | 5/1994 | Zhang et al. | |
| 5,365,875 A | 11/1994 | Asai et al. | |
| 5,366,909 A | 11/1994 | Song et al. | |
| 5,403,772 A | 4/1995 | Zhang et al. | |
| 5,413,958 A | 5/1995 | Imahashi et al. | |
| 5,512,494 A | 4/1996 | Tanabe | |
| 5,523,240 A | 6/1996 | Zhang et al. | |
| 5,523,587 A * | 6/1996 | Kwo | 257/64 |
| 5,576,543 A * | 11/1996 | Dingley | 250/311 |
| 5,578,520 A | 11/1996 | Zhang et al. | |
| 5,591,653 A | 1/1997 | Sameshima et al. | |
| 5,619,044 A | 4/1997 | Makita et al. | |
| 5,643,826 A | 7/1997 | Ohtani et al. | |
| 5,705,413 A | 1/1998 | Harkin et al. | |
| 5,726,487 A | 3/1998 | Sameshima et al. | |
| 5,753,541 A | 5/1998 | Shimizu | |
| 5,773,847 A | 6/1998 | Hayakawa | |
| 5,824,574 A | 10/1998 | Yamazaki et al. | |
| 5,858,821 A | 1/1999 | Dennison et al. | |
| 5,879,976 A | 3/1999 | Fujiwara | |
| 5,882,960 A | 3/1999 | Zhang et al. | |
| 5,895,933 A | 4/1999 | Zhang et al. | |
| 5,923,962 A | 7/1999 | Ohtani et al. | |
| 5,923,966 A | 7/1999 | Teramoto et al. | |
| 5,932,893 A | 8/1999 | Miyanaga et al. | |
| 5,943,593 A | 8/1999 | Noguchi et al. | |
| 5,956,581 A | 9/1999 | Yamazaki et al. | |
| 5,960,266 A | 9/1999 | Ishii et al. | |
| 5,985,740 A | 11/1999 | Yamazaki et al. | |
| 6,048,780 A | 4/2000 | Hayakawa | |
| 6,066,547 A | 5/2000 | Maekawa | |
| 6,087,679 A | 7/2000 | Yamazaki et al. | |
| 6,107,654 A | 8/2000 | Yamazaki | |
| 6,118,151 A | 9/2000 | Tsutsu | |
| 6,140,668 A | 10/2000 | Mei et al. | |
| 6,144,041 A | 11/2000 | Yamazaki et al. | |
| 6,172,380 B1 * | 1/2001 | Noguchi et al. | 257/64 |
| 6,285,042 B1 | 9/2001 | Ohtani et al. | |
| 6,287,944 B1 | 9/2001 | Hara et al. | |
| 6,303,963 B1 | 10/2001 | Ohtani et al. | |
| 6,307,214 B1 | 10/2001 | Ohtani et al. | |
| 6,307,220 B1 | 10/2001 | Yamazaki | |
| 6,335,541 B1 | 1/2002 | Ohtani et al. | |
| 6,342,409 B1 | 1/2002 | Seo | |
| 6,348,368 B1 | 2/2002 | Yamazaki et al. | |
| 6,373,075 B1 | 4/2002 | Yamazaki et al. | |
| 6,388,270 B1 | 5/2002 | Yamazaki et al. | |
| 6,407,430 B1 | 6/2002 | Ohtani et al. | |
| 6,452,211 B1 | 9/2002 | Ohtani et al. | |
| 6,482,684 B1 | 11/2002 | Yamazaki | |
| 6,545,320 B2 | 4/2003 | Ohtani et al. | |
| 6,566,754 B2 | 5/2003 | Hara et al. | |
| 6,589,822 B1 | 7/2003 | Yamazaki et al. | |
| 6,607,947 B1 | 8/2003 | Zhang et al. | |
| 6,610,996 B2 | 8/2003 | Yamazaki et al. | |
| 6,670,638 B2 * | 12/2003 | Tamura et al. | 257/64 |
| 6,677,191 B1 | 1/2004 | Battersby | |
| 6,690,068 B2 | 2/2004 | Yamazaki et al. | |
| 6,693,044 B1 | 2/2004 | Yamazaki et al. | |
| 6,703,265 B2 * | 3/2004 | Asami et al. | 438/150 |
| 6,730,549 B1 | 5/2004 | Zhang et al. | |
| 6,756,657 B1 * | 6/2004 | Zhang et al. | 257/627 |
| 6,787,807 B2 | 9/2004 | Yamazaki et al. | |
| 6,825,072 B2 | 11/2004 | Yamazaki et al. | |
| 6,828,179 B2 | 12/2004 | Yamazaki et al. | |
| 6,828,587 B2 | 12/2004 | Yamazaki et al. | |
| 6,841,434 B2 * | 1/2005 | Miyairi et al. | 438/166 |
| 6,903,372 B1 * | 6/2005 | Yamaguchi et al. | 257/66 |
| 7,166,500 B2 | 1/2007 | Yamazaki et al. | |
| 7,335,910 B2 * | 2/2008 | Kato et al. | 257/57 |
| 2002/0043660 A1 | 4/2002 | Yamazaki et al. | |

FOREIGN PATENT DOCUMENTS

| | | |
|---|---|---|
| JP | 03-284882 | 12/1991 |
| JP | 04-163910 | 6/1992 |
| JP | 04-168769 | 6/1992 |
| JP | 04-318973 | * 11/1992 |
| JP | 05-206464 | 8/1993 |
| JP | 05-291220 | 11/1993 |
| JP | 08-078329 | 3/1996 |
| JP | 08-321466 | 12/1996 |
| JP | 11-191628 | 7/1999 |
| JP | 11-204435 | 7/1999 |
| JP | 2000-156346 | 6/2000 |
| JP | 2001-127301 | 5/2001 |

OTHER PUBLICATIONS

Haji et al., *Mode of Growth and Microstructure of Polycrystalline Silicon Obtained by Solid-Phase Crystallization of an Amorphous Silicon Film*, J. Appl. Phys., vol. 75, No. 8, Apr. 15, 1994, pp. 3944-3952.

Hayzelden et al., *Silicide Formation and Silicide-Mediated Crystallization of Nickel-Implanted Amorphous Silicon Thin Films*, J. Appl. Phys., vol. 73, No. 12, Jun. 15, 1993, pp. 8279-8289.

Yamazaki et al. (JP 11-204435), Jul. 1999, (Translation).

R. Ishihara, et al., *Microtexture Analysis of Location Controlled Large Si Grain Formed by Excimer-Laser Crystallization Method*, AM-LCD '99, Digest of Technical Papers, Jul. 14-16, 1999, pp. 99-102.

Ching-Wei Lin et al., *High-Performance Low-Temperature Poly-Si TFTs Crystallized by Excimer Laser Irradiation with Recessed-Channel Structure*, IEEE Electron Device Letters, vol. 22, No. 6, pp. 269-271., Jun. 2001.

* cited by examiner

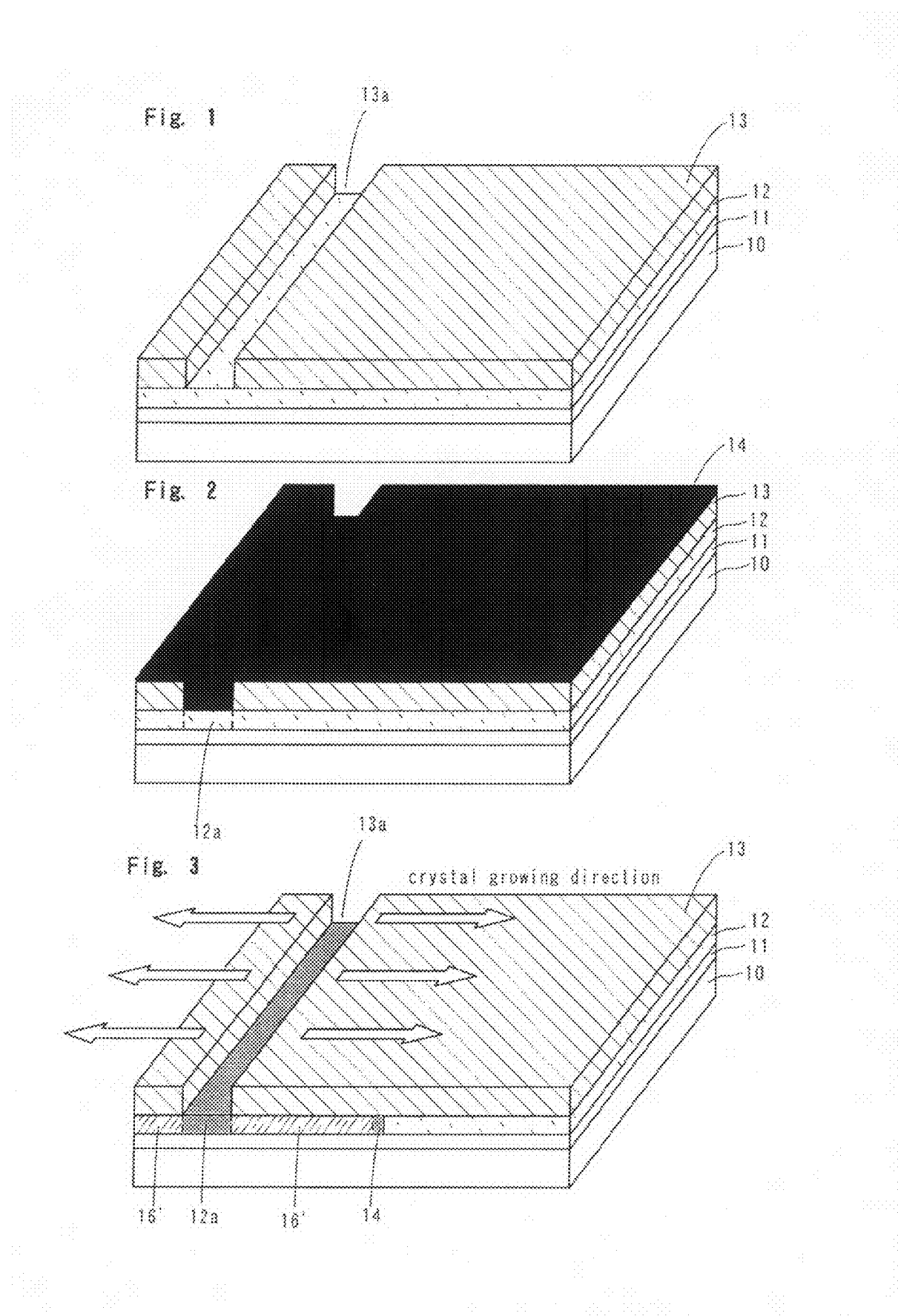

Fig. 6A
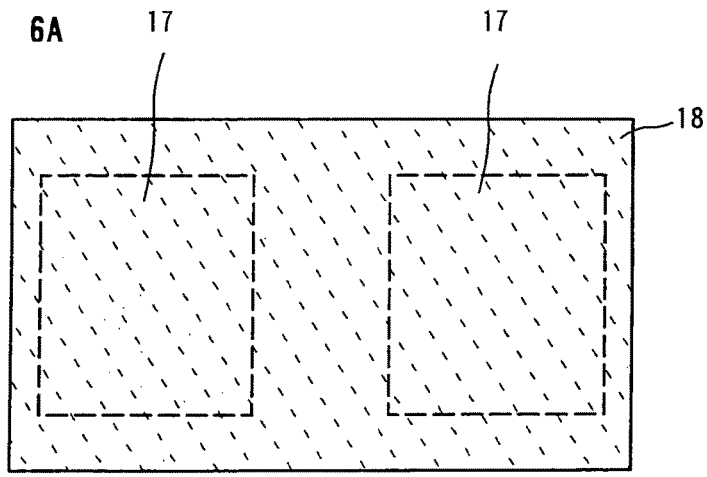
Fig. 6B
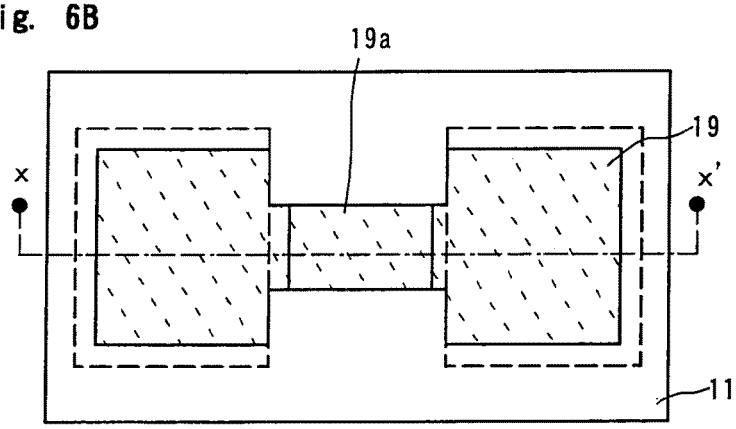
Fig. 6C  x—x' sectional view of Fig. 6B
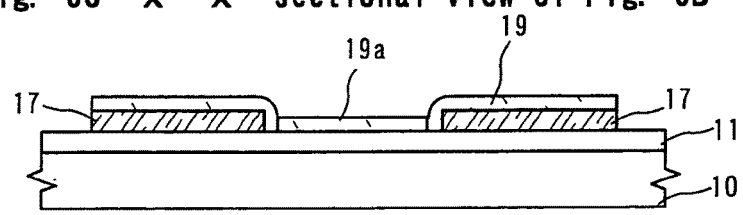

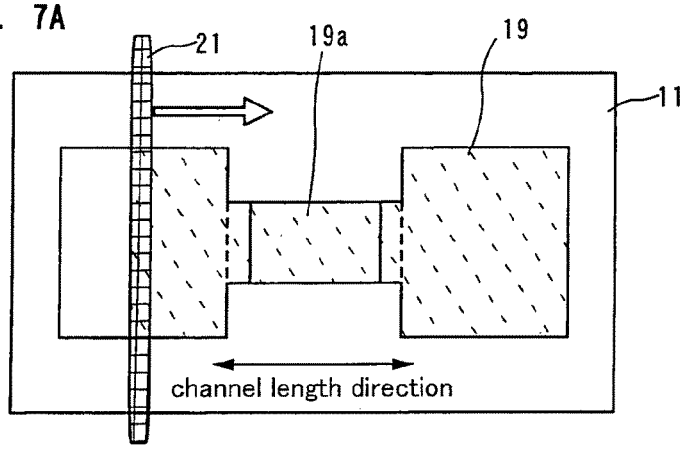
Fig. 7A
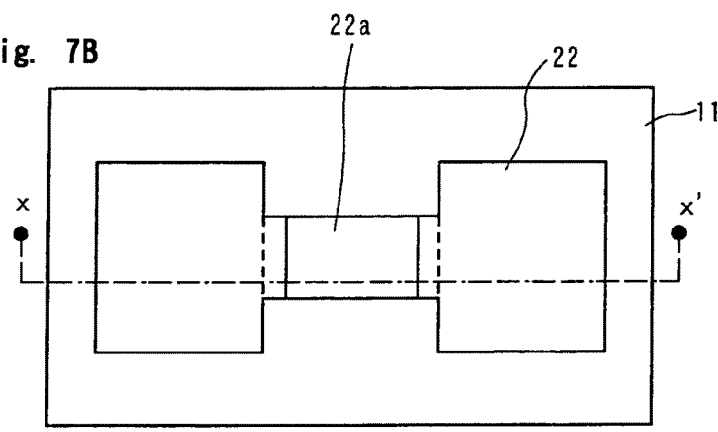
Fig. 7B
Fig. 7C x—x' sectional view of Fig. 7B
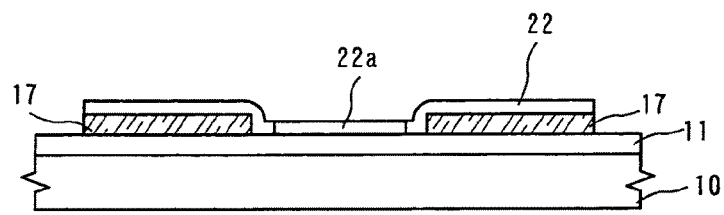
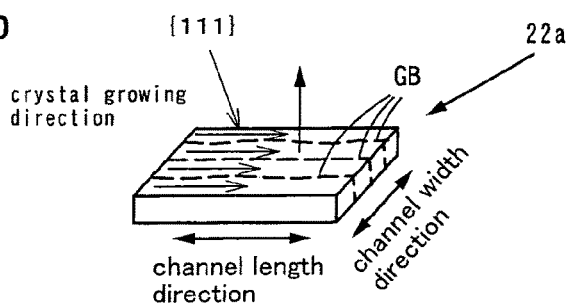
Fig. 7D

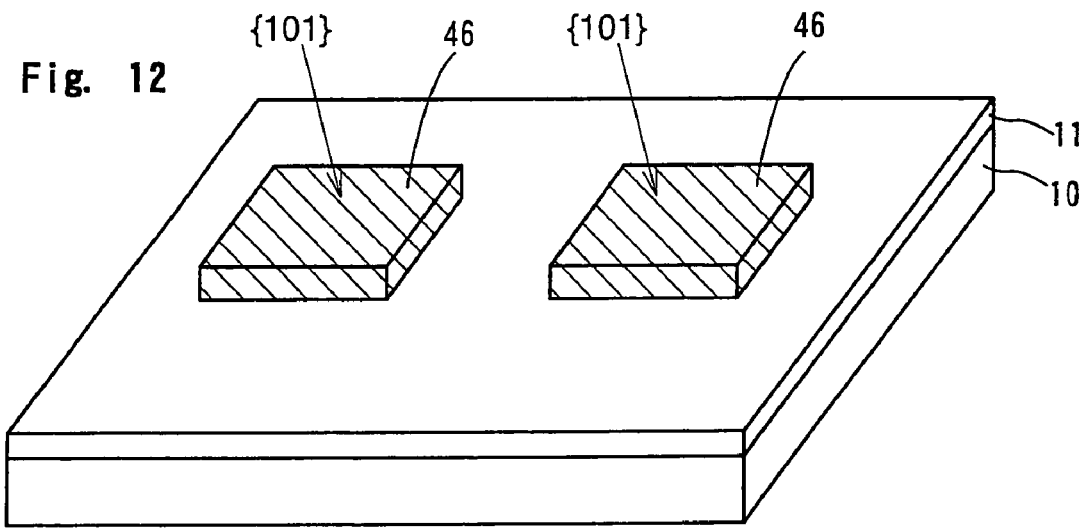
Fig. 12
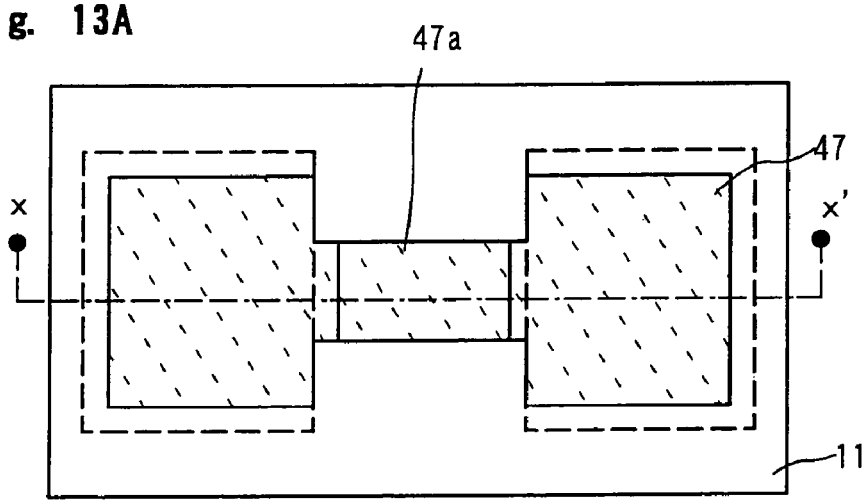
Fig. 13A
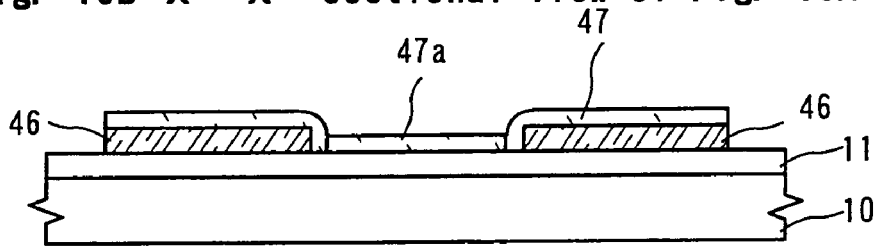
Fig. 13B x—x' sectional view of Fig. 13A Fig. 14A
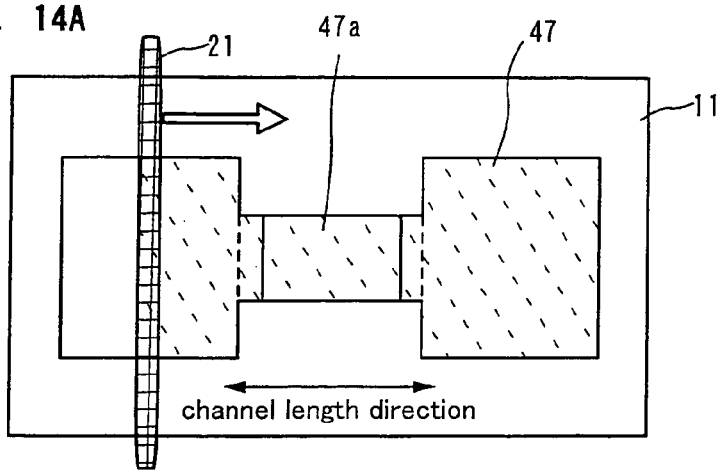
channel length direction
Fig. 14B
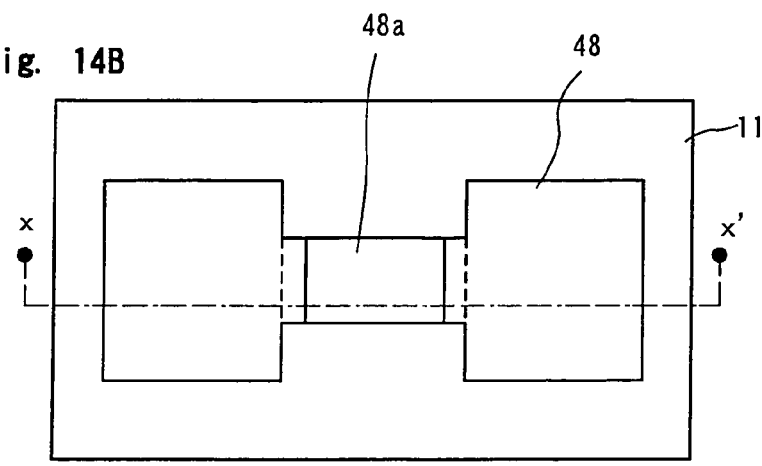
Fig. 14C x—x' sectional view of Fig. 14B
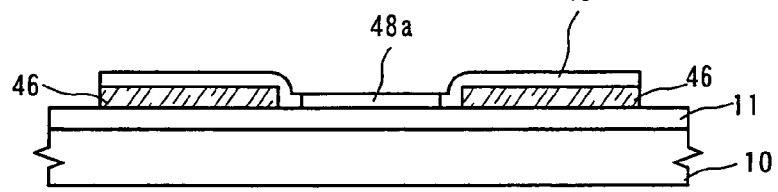
Fig. 14D
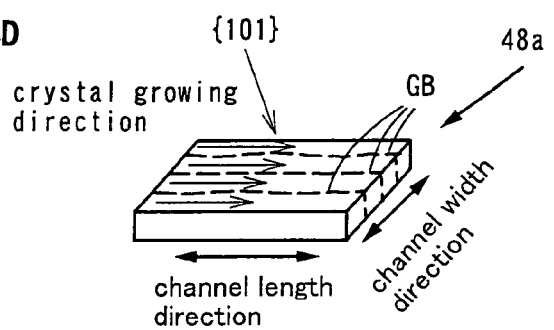

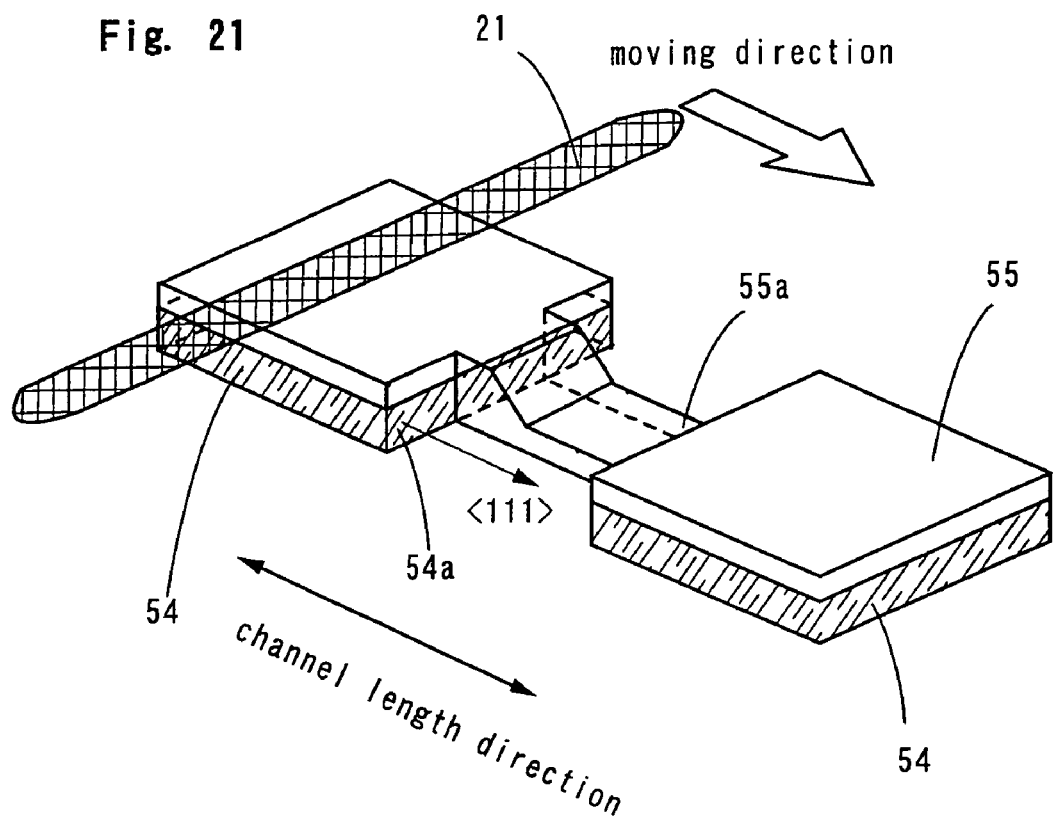

Fig. 24A
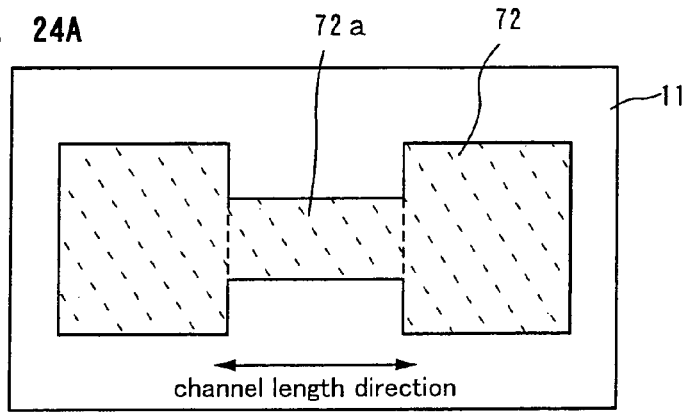
Fig. 24B
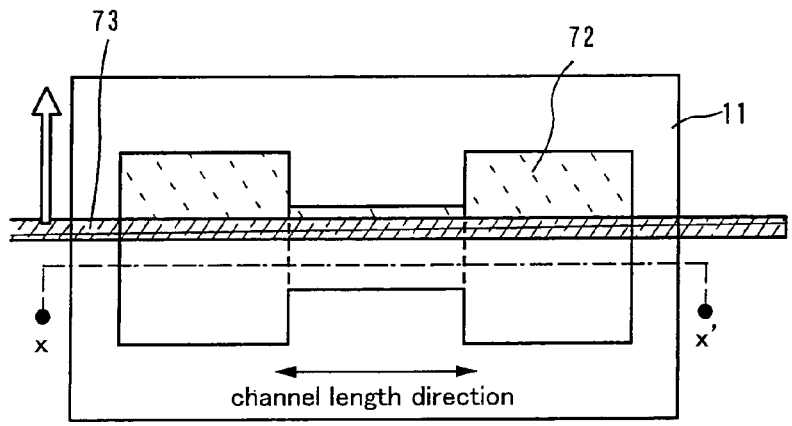
Fig. 24C x—x' sectional view of Fig. 24B
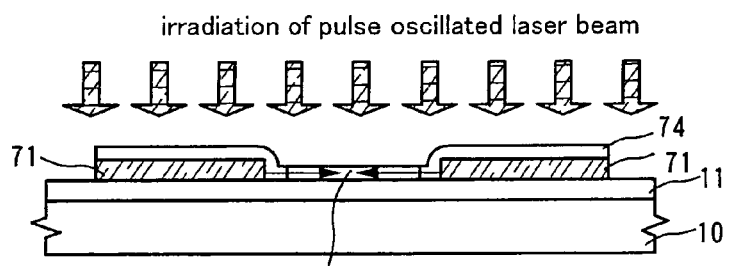
Fig. 24D
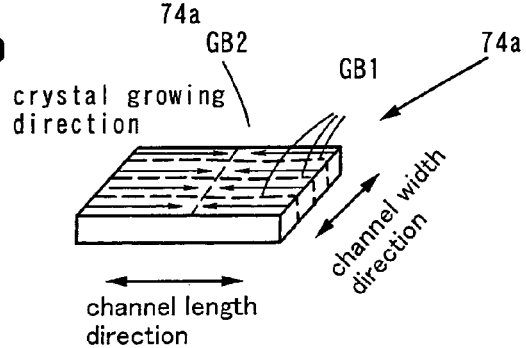

127-129 The first crystalline semiconductor layers
137, 138 The second crystalline semiconductor layers
141, 171 Electrodes

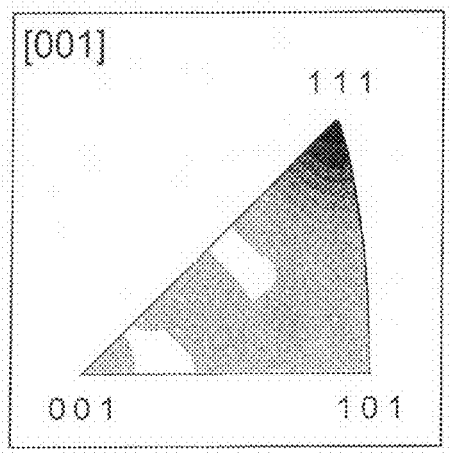
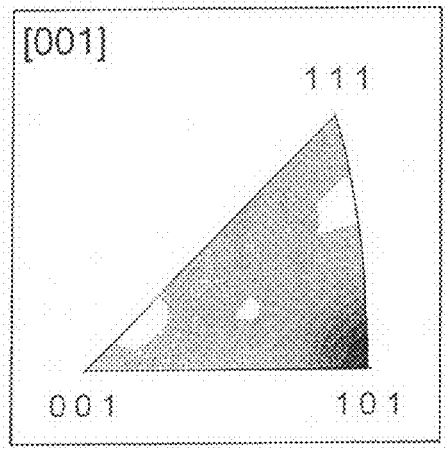
Fig. 36A An example of Embodiment 1
⟨0 0 1⟩3.0%
⟨0 1 1⟩5.1%
⟨1 1 1⟩49.2%
Fig. 36B An example of Embodiment 2
⟨0 0 1⟩0.2%
⟨0 1 1⟩60.0%
⟨1 1 1⟩1.0%
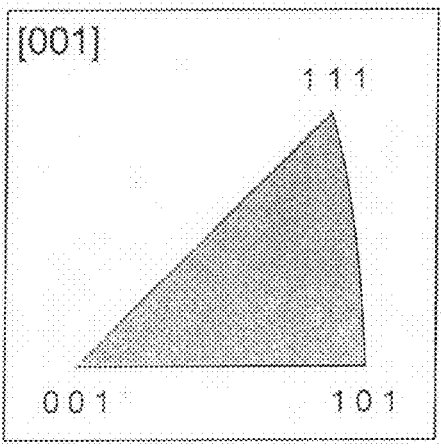
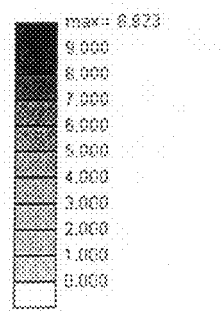
Fig. 36C Reference example 1
⟨0 0 1⟩0.9%
⟨0 1 1⟩7.5%
⟨1 1 1⟩14.0%

Reference example 2
Polycrystalline silicon
  ⟨0 0 1⟩7.3%
  ⟨0 1 1⟩3.0%
  ⟨1 1 1⟩8.9%

SEMICONDUCTOR DEVICE AND METHOD OF FABRICATING THE SAME

BACKGROUND OF THE INVENTION

1. Field of the Invention

The present invention relates to a semiconductor device in which an active layer is formed of a crystalline semiconductor film having a crystal structure and a method of forming the same. Particularly, the invention relates to a thin film transistor in which an active region is formed of a crystalline semiconductor film, a semiconductor device such as an integrated circuit using the thin film transistor and a method of forming fabricating the semiconductor device. Further, in the specification, a semiconductor device refers to general device functioning by utilizing a semiconductor characteristic, including, for example, a semiconductor integrated circuit, an active matrix type display device, and other electronic device such as an electronic device mounted with a semiconductor integrated circuit or an active matrix type display device.

2. Description of the Related Art

In developing an active matrix type display which is a kind of a flat panel display, there has been developed a technology of forming a thin film transistor (hereinafter, described as TFT) using a crystalline semiconductor film having a crystal structure for an active layer as an element of a pixel portion or a transistor of an integrated circuit for driving the pixel portion and there is realized a monolithic type display integrated with an integrated circuit of a pixel portion and a drive circuit necessary for driving the pixel portion on one glass substrate or quartz substrate. There have been sold various commodities such as a notebook type personal computer or a portable telephone mounted with an active matrix type liquid crystal display device formed by TFT using a polycrystal silicon film produced by crystallizing an amorphous silicon film.

There is requested TFT having fast operation speed, that is, high field effect mobility in order to realize higher pixel formation and higher miniaturization of a monolithic type of an active matrix type display. In order to achieve high field effect mobility, it is necessary to form TFT by using a crystalline silicon film produced by crystallizing an amorphous silicon film and for that purpose, an intensive research has been carried out on a technology of crystallizing a silicon film. As the crystallizing technology, there is known a method of heating an amorphous semiconductor film by a heating furnace or RTA apparatus for solid phase growth or a method of crystallizing an amorphous film by heating the amorphous film by irradiating laser beam.

Although in order to increase the field effect mobility of TFT, carriers may be moved smoothly by a channel without being scattered, in the case of TFT using a crystalline silicon film currently reduced to practice, there are many grain boundaries in the channel and therefore, the field effect mobility of TFT cannot be made higher than that of a transistor using a silicon wafer.

Hence, it has been tried to enlarge a crystal grain of a semiconductor of the channel to bring the field effect mobility of TFT close to that of a transistor of a single crystal silicon wafer. Because by enlarging the crystal grain, a number of crystal grain boundaries of a semiconductor at a channel of TFT is reduced and therefore, a probability that carriers are scattered by crystal grain boundaries can be reduced.

Further, although it is known that easiness of flowing carriers in a semiconductor differs also by crystal orientation, according to the conventional crystallizing technology, it is very difficult to align crystal orientation in the direction of carriers flowing in the channel. According to the above-described conventional crystallizing technology, crystals grow with crystal nuclei accidentally produced in an amorphous silicon film as seeds and therefore, the crystal grain boundaries cannot be eliminated at all, further, it is very difficult to control positions of crystal grain boundaries or crystal orientation.

That the positions of the crystal grain boundaries and the crystal orientation cannot be aligned in this way, is that the crystal structure of the crystallized silicon film differs at respective locations and therefore, even when TFT is formed by using the same silicon film, there is constituted one of causes of varying characteristics of TFT at respective locations.

Further, as TFT, there is also requested a characteristic that as a switching element, a threshold voltage value is small and a sub threshold value (S value) is small. It is known that in order to improve such a characteristic, a film thickness of the semiconductor film of the channel portion is thinned. This is because a characteristic of a sub threshold region on I-V characteristic is improved since when the semiconductor film of the channel portion is thinned, spread of a depletion layer (channel) in a film thickness direction (vertical direction) is restrained.

In the case of TFT using a polycrystal silicon film, normally, it is preferable to thin a channel forming region to be equal to or smaller than about 60 nm. However, in the case of crystallization by solid phase growth using a heating furnace or the like, when the film thickness is thinned, there is a case that it is difficult to increase a crystal grain size.

Further, also in the case of crystallization by continuous wave laser beam such as YAG laser or pulse laser beam such as excimer laser, similar to the case of solid phase growth using a heating furnace or the like, it is difficult to thin the film thickness of the amorphous silicon film. This is because there is posed a new problem that abrasion is liable to be caused and a margin of optimum energy is narrowed and in the case of continuous wave laser beam, unless the film thickness is equal to or larger than 60 nm in the case of continuous wave laser beam or 50 nm in the case of excimer laser, it is difficult to set optimum energy and therefore, it is difficult to reproducibly carry out crystallization.

Further, conventionally in order to thin the thickness of the semiconductor film of the channel portion, there is known a method of using thermal oxidation, however, according to the method, only a limited substrate having heat resistance, such as a quartz substrate or a silicon wafer, can be used.

As described above, according to conventional crystallization by laser annealing or crystallization of an amorphous silicon by solid phase growth by using an electric furnace, the crystallization is derived from crystal growth from accidentally produced crystal nuclei, a position of generating and a density of generating crystal nuclei cannot be controlled, further, orientations of crystalline planes of a semiconductor film cannot be controlled.

SUMMARY OF THE INVENTION

It is an object of the invention to provide a thin film transistor resolving the above-described problems, in which a field effect mobility is high, a threshold characteristic is improved and a variation in characteristics is small.

Further, it is an object of the invention to provide a method capable of growing a crystal such that a direction of a crystal grain boundary becomes in parallel with a channel length direction and an orientation of an axis of growing the crystal becomes uniform by controlling a position of the crystal grain boundary and a crystal orientation of a crystal grain of a crystalline semiconductor film for constituting a channel. Furthermore, the method of the invention is characterized in being capable of utilizing a substrate having a strain point of about 600° C. such as a glass substrate.

As described above, the crystallization of an amorphous silicon film by using an electric furnace or laser beam according to the conventional example, depends on crystal growth from a crystal nucleus which is accidentally generated, a position of generating and a density of generating the crystal nucleus cannot be controlled, further, an orientation of a crystal plane of a crystalline semiconductor film cannot be aligned and a position of a crystal grain boundary cannot be controlled.

In order to resolve the above-described problem, there is provided a new method of fabricating a crystalline semiconductor layer used for a channel forming region of a semiconductor element of a thin film transistor.

According to an aspect of the invention, there is provided a semiconductor device which is a semiconductor device comprising a thin film transistor comprising two first crystalline semiconductor layers and a second crystalline semiconductor layer provided on two of the first crystalline semiconductor layers in contact therewith wherein a source region and a drain region of the thin film transistor are respectively provided in a portion in which the first and the second crystalline semiconductor layers are laminated, a channel forming region comprises the second crystalline semiconductor layer and the channel forming region is provided with a highest rate of $\{111\}$ among crystal planes of $\{001\}$, $\{101\}$ and $\{111\}$.

Further, according to another aspect of the invention, there is provided a semiconductor device which is a semiconductor device comprising a thin film transistor comprising two first crystalline semiconductor layers and a second crystalline semiconductor layer provided on two of the first crystalline semiconductor layers in contact therewith wherein a source region and a drain region of the thin film transistor are respectively provided in a portion in which the first and the second crystalline semiconductor layers are laminated, a channel forming region comprises the second crystalline semiconductor layer and a rate of $\{101\}$ is the highest among crystals of $\{001\}$, $\{101\}$ and $\{111\}$ included in the channel forming region.

A distribution of a crystal orientation of a semiconductor is provided from an electron backscatter diffraction pattern (EBSP). EBSP is a method of detecting a crystal orientation from backscattering of a primary electron by providing an exclusive detector to a scanning electron microscopy (SEM) (hereinafter, the method is referred to as EBSP method for convenience).

When an electron beam is incident on a sample having a crystal structure, nonelastic scattering occurs also to a backwards and a linear pattern particular to a crystal orientation by Bragg's diffraction in the sample (generally referred to as Kikuchi image) is also observed in the nonelastic scattering. The EBSP method provides the crystal orientation of the sample by analyzing Kikuchi image displayed on a detector screen.

According to a sample of a polycrystal structure, respective crystal grains are provided with different crystal orientations. By repeating orientation analysis while moving a position of the sample to which the electron beam impinges (mapping measurement), information of crystal orientation can be provided with respect to a planar sample. Although a size of incident electron beam differs by a type of an electron gun of a scanning electron microscopy, in the case of a Schottky electric field radiation type, very slender electron beam having a spot diameter of 10 through 20 nm is irradiated. According to the mapping measurement, the larger the number of measured points and the wider the measured region, the more averaged information of the crystal orientation can be provided. Actually, in a region of 100×100 µm², measurement of about 10000 points (1 µm interval) through 40000 points (0.5 µm interval) is carried out.

When all of crystal orientations of respective crystal grains are provided by the mapping measurement, a state of crystal orientation with respect to a film can statistically be known. FIGS. 35A and 35B show an example of a standard triangle of a silicon film having a polycrystal structure provided by the EBSP method. The standard triangle is frequently used when a dominant orientation of a sample having a polycrystal structure is displayed, collectively displaying to which lattice plane a specific plane of a sample (in this case, film surface) coincides.

A frame in a fan-like shape of FIG. 35A is generally referred to as the standard triangle and all indices in a cubic system are included therein. Further, a length in FIGS. 35A and 35B corresponds to an angle in crystal orientation. For example, an interval between $\{001\}$ and $\{101\}$ is 45 degrees, an interval between $\{101\}$ and $\{111\}$ is 35.26 degrees and an interval between $\{111\}$ and $\{001\}$ is 54.74 degrees. Further, white dotted lines indicate a range of a deviation angle between 5 degrees and 10 degrees from $\{101\}$.

FIG. 35A is plotted with all measured points in mapping (in this example, 11655 points) in the standard triangle. It is known that a density of points is increased at a vicinity of $\{101\}$. FIG. 35B displays a degree of concentrating the points by contour lines. A numerical value in the diagram designates a multiplication factor when respective crystal grains are assumed to be oriented completely disorderly, that is, when the points in the standard triangle are distributed without deviation, and is a nondimensional number.

When in this way, predominant orientation to a specific index (in this case, $\{101\}$) is known, by numerizing a rate of crystal grains gathering at a vicinity of the index, a degree of the predominant orientation can be imaged further easily.

For example, in the standard triangle exemplified in FIG. 35A, a deviation angle from $\{101\}$ is pertinently determined to be equal to or smaller than 5 degrees or equal to or smaller than 10 degrees, and a rate of a number of points present in the range (shown by white dotted lines in the drawing) to a total can be defined as an orientation rate and can be calculated by the following equation.

$\{101\}$ orientation rate=a number of measured points having angles made by $\{101\}$ lattice and film surface within an allowable value÷a total number of measured points.

The rate can also be explained as follows. In an actual crystalline silicon film distribution of which is concentrated to a vicinity of $\{101\}$ as shown by FIG. 35A, although <101> orientation of the respective crystal grain is in a direction perpendicular to a substrate, the direction is not in an ideal normal line direction relative to the substrate but the crystal axis of the respective crystal grain seems to align with some fluctuation around a normal line. By constituting the allowable value by the angle of fluctuation (deviation angle from normal line), for example, by setting 5 degrees and 10 degree, and the orientation rate is calculated by constituting the fluctuation from the normal line direction of the crystal plane smaller than the allowable value as a numerator of the right side of the above-described equation, which is meant by the above-described equation.

For example, with regard to <101> orientation of the crystal grain, although the allowable angle is not included in the range of 10 degrees, the allowable angle is included in the range of 5 degrees. In data, described below, the allowable value of the deviation angle may be determined as 5 degrees and the orientation rate of the crystal may be calculated as the rate of the crystal grain satisfying the allowable value.

Further, in the specification, S-4300SE type scanning electron microscope made by Hitachi Science System Corporation is used as a scanning electron microscope and "Orientation Imaging Microscope" made by TSL Corporation is used as an exclusive detector.

According to the invention, in order to crystallize a semiconductor layer for constituting a channel forming region, a first crystalline semiconductor film for constituting a seed of crystal growth is formed as a lower layer and an amorphous semiconductor film is formed as an upper layer in close contact with the crystalline semiconductor film. Further, by irradiating continuous wave laser beam or pulse laser beam to the upper layer of the amorphous semiconductor film while moving relative to the substrate, the upper layer of the amorphous semiconductor film is crystallized by constituting the seed by the lower layer of the crystalline semiconductor. The invention is characterized in using the provided crystalline semiconductor layer of the upper layer as a channel of a semiconductor element, such as a thin film transistor and a diode, and using a region in which the lower layer of the first crystalline semiconductor layer and the upper layer of the crystalline semiconductor layer are overlapped for an impurity region of a source region or a drain region.

According to the invention, by aligning a crystal orientation of the lower layer of the crystalline semiconductor film for constituting the seed of crystal and subjecting the upper layer of the amorphous semiconductor layer to crystal growth (lateral growth) from a crystal plane aligned with a crystal orientation in a direction of flowing carriers (channel length direction), the crystal orientation of the crystalline semiconductor layer is made uniform with respect to the channel length direction and the position of the crystal grain boundary is controlled.

For that purpose, according to the invention, one of methods of forming a lower layer of a first crystalline semiconductor layer is a method of forming a first semiconductor film comprising an amorphous semiconductor over a substrate, selectively adding a metal element for reducing a crystallization energy of a semiconductor to the first semiconductor film, crystallizing the first semiconductor film by a heating treatment and patterning the crystallized first semiconductor film in a predetermined shape to thereby form the first crystalline semiconductor layer. According to the provided first crystalline semiconductor layer, an orientation rate of {111} is the highest among crystal planes of {001} {101} and {111}.

As the above-described first amorphous semiconductor film, there is used an amorphous semiconductor comprising silicon, a compound of silicon and germanium ($Si_xGe_{1-x}$ (0<x<1)) or a single element of germanium. The metal element is a metal element forming a metal compound by reacting with silicon (Si) or germanium (Ge) and any element of Pd, Pt, Ni, Cr, Fe, Co, Ti, Au, Cu and Rh can be used.

As the above-described metal element, Ni can most preferably be used. Because it seems that when a case in which a semiconductor is silicon is taken as an example, nickel silicide ($NiSi_2$) produced by reacting nickel and silicon is of a fluorite structure and lattice constant of $NiSi_2$ is very near to lattice constant of single crystal silicon.

As a method of adding the metal element, there are methods of coating a solution dissolved with a metal element or a compound of a metal element or a paste including a metal element or a compound of a metal element, a method of forming a metal element or a compound of a metal element on an amorphous semiconductor film by a sputtering method or a CVD method, a method of accelerating ions of a metal element and adding the ions to a semiconductor film such as plasma doping or an ion implantation method and a method of treating an amorphous semiconductor film by plasma including a metal element.

Energy required for forming a metal compound (silicide in the case of silicon) by reacting a metal element such as nickel with a semiconductor is lower than energy for crystallizing a semiconductor such as amorphous silicon. Therefore, by carrying out crystallization by forming a compound by reacting an amorphous silicon film with a metal element, the crystallization can be carried out at temperature (energy) lower than that in spontaneously generating nuclei in a semiconductor film.

The above-described method of crystallizing the first crystalline semiconductor is a method of forming the crystalline semiconductor film having a high orientation rate with respect to a predetermined crystal plane by partially adding a metal element to the first amorphous semiconductor film and by forming an amorphous semiconductor whose major component is silicon including germanium, even when a position of adding a metal element is not particularly controlled, it is possible to form a crystalline semiconductor film having the highest orientation rate of {101} among crystal planes of {001}, {101} and {111}.

That is, according to the invention, other method of forming a first crystalline semiconductor layer of a lower layer includes a method of forming a first crystalline semiconductor layer comprising a crystalline semiconductor by forming a first amorphous semiconductor film comprising an amorphous semiconductor film whose major component is silicon including germanium over a substrate, adding a metal element for reducing crystallization energy of a semiconductor to the first amorphous semiconductor film, heating the first amorphous semiconductor film to crystallize and patterning the crystallized first crystalline semiconductor film in a predetermined shape.

In the above-described method of forming the first crystalline semiconductor layer, a metal element used, a method of adding a metal element and a method of crystallizing a first semiconductor comprising an amorphous semiconductor can be made the same as those in the case of forming a crystalline semiconductor layer having the highest orientation rate of {111}, mentioned above, and the above-described metal element is a metal element for forming a metal compound by reacting with silicon (Si) or germanium (Ge) and any element of Pd, Pt, Ni, Cr, Fe, Co, Ti, Au, Cu and Rh can be used.

As the method of adding a metal element, there are methods of coating a solution dissolved with a metal element or a compound of a metal element or a paste including a metal element or a compound of a metal element, a method of forming a metal element or a compound of a metal element on an amorphous semiconductor film by a sputtering method or a CVD method, a method of accelerating ions of a metal element and adding the ions to a semiconductor film such as plasma doping or an ion implantation method and a method of treating an amorphous semiconductor film by plasma including a metal element.

In heating to crystallize an amorphous semiconductor film by using the metal element, mentioned above, there is selected means capable of subjecting an amorphous semiconductor film to solid phase growth such as a heating treatment in an electric furnace or a method of utilizing heat radiation by an infrared ray lamp.

Further, as described above, according to the invention, when a first amorphous semiconductor film is crystallized by using a metal element, after crystallization, in order to remove an intentionally added metal element from the crystallized first semiconductor film, a gettering treatment may be carried out.

As a method of gettering, there are methods of forming a film for constituting a gettering sink on the crystallized semiconductor film and carrying out a heating treatment to thereby absorb the metal element to the gettering sink. As the film for constituting the gettering sink, an amorphous silicon film including argon or an amorphous silicon film including phosphor can be used.

Although in the above, as a method of crystallizing a first semiconductor film for constituting a seed, an explanation has been given of a method of adding and crystallizing a metal element, there are also crystallizing methods in which a metal element is not added. As one of the methods, an amorphous semiconductor of a lower layer is crystallized by continuous wave laser beam and another is constructed by a constitution of forming a first semiconductor film comprising an amorphous semiconductor over a substrate, irradiating the continuous wave laser beam to the first semiconductor film while moving an irradiated region by the continuous wave laser beam relative to the substrate to crystallize and patterning the crystallized first semiconductor film in a predetermined shape to thereby form the first crystalline semiconductor layer comprising a crystalline semiconductor.

Still another of the methods is a method of forming a first semiconductor film comprising an amorphous semiconductor over a substrate, patterning the first semiconductor film comprising the amorphous semiconductor in a predetermined shape to thereby form a first amorphous semiconductor layer and irradiating continuous wave laser beam to the first amorphous semiconductor layer while moving an irradiated region by the continuous wave laser beam relative to the substrate to crystallize to thereby form the first crystalline semiconductor layer.

According to the invention, the first crystalline semiconductor layer is patterned in a predetermined shape and the shape is patterned such that the first crystalline semiconductor layer constitutes a seed crystal for crystallizing the upper layer of the second amorphous semiconductor film and functions also as a portion connected to an electrode or a wiring such as a source region or a drain region of a thin film transistor.

Further, the invention is characterized in a method of fabricating a semiconductor device of forming a second semiconductor film comprising an amorphous semiconductor on a first crystalline semiconductor layer formed by any of the above-described methods in contact with the first crystalline semiconductor layer, patterning the second semiconductor film in a predetermined shape to include a region overlapped with the first crystalline semiconductor layer and a region which is not overlapped with the first crystalline semiconductor layer in a predetermined shape to thereby form a second amorphous semiconductor layer, irradiating continuous wave laser beam to the second amorphous semiconductor layer while moving the continuous wave laser beam relative to the substrate to crystallize the second amorphous semiconductor layer to thereby form the second crystalline semiconductor layer, in which in crystallizing the second amorphous semiconductor layer, a region in which the continuous wave laser beam is irradiated is moved from the region in which the second amorphous semiconductor layer is overlapped with the first crystalline semiconductor layer to the region in which the second amorphous semiconductor layer is not overlapped with the first crystalline semiconductor layer.

Further, according to the invention, in crystallizing the second amorphous semiconductor layer, instead of irradiating continuous wave laser beam, pulse laser beam may be irradiated. In this case, a method of moving laser beam is different from the above one and in crystallizing the second amorphous semiconductor layer, the pulse laser beam is moved such that both of the region in which the second amorphous semiconductor layer is overlapped with the first crystalline semiconductor layer and the region in which the second amorphous semiconductor layer is not overlapped with the first crystalline semiconductor layer, are included in the irradiated region of the pulse laser beam.

By irradiating the continuous wave laser beam or the pulse laser beam while moving the irradiated region as described above, crystal growth is progressed in a horizontal direction relative to a formed plane (flat plane of substrate) in the second amorphous semiconductor layer by constituting a seed in the first crystalline semiconductor layer and progressed such that a crystal plane of the first crystalline semiconductor layer is copied.

Therefore, by carrying out crystal growth from a plane of the first crystalline semiconductor layer having an aligned crystal orientation, the region in which the second crystalline semiconductor layer is not overlapped with the first crystalline semiconductor layer can be subjected to crystal growth in a constant direction.

Therefore, when a channel forming region of a semiconductor element is constituted by the region in which the second crystalline semiconductor layer having the above-described crystal structure is not overlapped with the first crystalline semiconductor layer, a direction of crystal growth of the region can be made parallel with a channel length direction (direction of moving carriers).

According to the invention, it does not only indicate an amorphous structure in a narrow sense but includes also an amorphous semiconductor partially including small crystals that a crystal structure of a semiconductor is amorphous.

According to the invention, as continuous wave laser beam, laser beam emitted from a gas laser oscillating apparatus or a solid state laser oscillating apparatus can be selected. For example, as a solid state laser oscillating apparatus, there is a laser oscillating apparatus using a crystal constituted by a crystal of YAG, $YVO_4$, YLF, $YAlO_3$ doped with Cr, Nd, Er, Ho, Ce, Co, Ti or Tm. A wavelength of a basic wave emitted from the laser oscillating apparatus is a wavelength in a range of 1 μm through 2 μm although the wavelength differs by a doped element.

Further, as a gas laser oscillating apparatus, a gas oscillating laser apparatus using argon laser or krypton laser can be selected.

According to the invention, as a pulse oscillating laser, an excimer laser oscillating apparatus using a gas of a halogenated compound such as ArF, KrF, XeCl, or a solid state laser oscillating apparatus using a crystal of YAG, $YVO_4$, YLF or $YAlO_3$ doped with Cr, Nd, Er, Ho, Ce, Co, Ti or Tm can be used. Although laser beam emitted from an excimer laser oscillating apparatus is ultraviolet beam having a wavelength region of 400 nm through 200 nm, in the case of solid state laser beam, a wavelength of a basic wave excited from the crystal is about 1 through 2 μm.

In order to efficiently use energy of laser beam in crystallizing an amorphous semiconductor film, a wavelength of continuous wave laser beam actually irradiated to an amorphous semiconductor film to be crystallized, is preferably a wavelength effectively absorbed in an amorphous semiconductor film, that is, a wavelength from a visible light range to an ultraviolet ray range. Therefore, in the case of laser having a basic wave excited by a laser oscillating apparatus from 1 µm to 2 µm, it is preferable to apply a second harmonic through a fourth harmonic of a basic wave.

Representatively, in crystallizing an amorphous silicon film, in the case of Nd: $YVO_4$ laser oscillating apparatus (continuous oscillation or pulse oscillation), a wavelength of a basic wave excited from crystal is 1064 nm and therefore, it is preferable to use a second harmonic (532 nm) for laser beam to be irradiated.

Further, in the specification, when continuous wave laser beam or pulse laser beam is irradiated in other than crystallizing a semiconductor, the above-described laser apparatus can be utilized.

Further, according to the invention, moving an irradiated region by continuous wave laser beam or pulse laser beam relative to a substrate, means either scanning laser beam by fixing a substrate and moving laser beam by a scanning optical system, or scanning laser beam by fixing an irradiated region by laser beam and moving a substrate by a stage having a moving mechanism. Further, both of an irradiated region of laser beam and a substrate may be moved.

Further, according to the invention, when a first crystalline semiconductor layer is formed by using a metal element having effect of reducing energy for crystallization, a film thickness may be about 50 nm through 100 nm. This is because when the film thickness becomes thinner than 50 nm, it is difficult to progress crystal growth as described above. Further, because when the film thickness exceeds 100 nm, it is difficult to constitute a single crystal grain in a film thickness direction and a metal element necessary for crystallization is increased.

Further, when a first crystalline semiconductor layer is formed by using continuous wave laser beam, the film thickness may be 30 nm through 400 nm, further preferably, 50 nm through 150 nm.

Further, conventionally, when an amorphous semiconductor film is crystallized by using continuous wave laser beam, due to a problem of a margin of irradiation energy, it is necessary to make the film thickness thicker than 60 nm. According to the invention, in order to crystallize a second amorphous semiconductor film, continuous wave laser beam is used, since in the second crystalline semiconductor layer, crystal growth is carried out by constituting a seed by the first crystalline semiconductor layer, that is, since a nuclei generating portion for crystal growth can be controlled and therefore, the thickness of the second crystalline semiconductor layer can be thinned to a range equal to or smaller than 60 nm, preferably 10 through 60 nm, further preferably, a range of 20 through 40 nm.

Further, also in crystallizing by using pulse laser beam, although it has conventionally been difficult to crystallize an amorphous semiconductor film thinner than 50 nm, in the case of the invention, from the above-described similar reason, the thickness of the second crystalline semiconductor layer can be thinned to a range equal to or smaller than 50 nm, preferably 10 through 50 nm, further preferably, to a range of 20 through 40 nm.

BRIEF DESCRIPTION OF THE DRAWINGS

FIG. 1 is a perspective view showing a method of forming a first crystalline semiconductor layer (Embodiment 1);

FIG. 2 is a view continued from FIG. 1 showing the method of forming the first crystalline semiconductor film (Embodiment 1);

FIG. 3 is a view continued from FIG. 2 showing the method of forming the first crystalline semiconductor film (Embodiment 1);

FIGS. 6A, 6B and 6C are views continued from FIG. 5 showing a method of forming a second amorphous semiconductor layer (Embodiment 1);

FIGS. 7A, 7B, 7C and 7D are views continued from FIGS. 6A, 6B and 6C showing a method of forming a second crystalline semiconductor layer by crystallization by continuous wave laser beam (Embodiment 1);

FIG. 12 is a view continued from FIG. 11 showing the method of forming the first crystalline semiconductor layer (Embodiment 2);

FIGS. 13A and 13B are views continued from FIG. 12 showing a method of forming a second amorphous semiconductor layer (Embodiment 2);

FIGS. 14A, 14B, 14C and 14D are views continued from FIGS. 13A and 13B showing a method of forming a second crystalline semiconductor layer by crystallization by continuous wave laser beam (Embodiment 2);

FIG. 21 is a perspective view in correspondence with FIGS. 20A and 20B showing the method of forming the second crystalline semiconductor layer by continuous wave laser beam (Embodiment 3);

FIGS. 24A, 24B, 24C and 24D are views showing a method of forming a second crystalline semiconductor layer by crystallization by pulse laser beam Embodiment 6;

FIGS. 36A, 36B and 36C show standard triangles of the first crystalline semiconductor layers of Embodiment 11, Embodiment 2 and Reference Example 1.

DETAILED DESCRIPTION OF THE PREFERRED EMBODIMENTS

Figure 4:
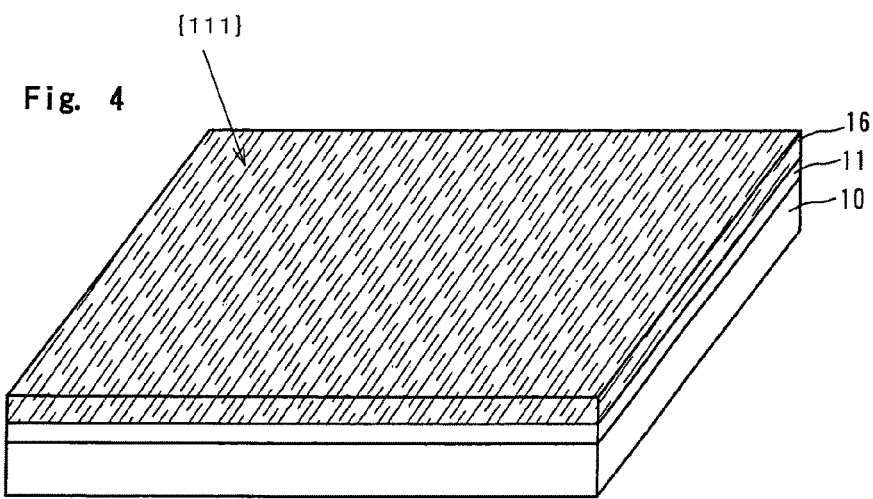
FIG. 4 is a view continued from FIG. 3 showing the method of forming the first crystalline semiconductor (Embodiment 1)

An explanation will be given of embodiments of the invention in reference to FIGS. 1 through 25B.

Embodiment 1

According to the embodiment, an explanation will be given of an example of a method of forming a first crystalline semiconductor layer by selectively-adding a metal element for promoting crystallization to a first amorphous semiconductor film. According to the embodiment, an explanation will be given of using nickel (Ni) and using a solution as a method of adding the metal element.

Refer to FIG. 1

There is prepared a substrate 10 for forming a crystalline semiconductor layer. As the substrate 10, a substrate comprising glass of barium boro-silicate glass or aluminum boro-silicate glass, or a substrate comprising quartz or silicon wafer can pertinently be selected in accordance with use of a semiconductor device or process conditions of temperature and the like. A substrate comprising a plastic material having high heat resistance of, for example, polycarbonate, polyimide or acrylic material can also be used when the material can withstand process temperature. Further, the shape of the substrate 10 includes a flat surface and/or a curved surface and a substrate in a shape of a flat plate, a shape of a strip or an elongated shape may pertinently be selected in accordance with processes or fabricating apparatus.

When a glass substrate including impurities as in glass for the substrate 10, before forming a first semiconductor film 12 comprising an amorphous semiconductor, in order to prevent a semiconductor film from being contaminated, an insulating film for constituting a base film 11 is formed. As the insulating film, a single layer of a silicon oxide film, a silicon nitride film, a silicon oxynitride film, an aluminum nitride film, a diamond-like carbon film or a multi-layer film by pertinently combining these films is formed. Further, as a film forming method, a publicly-known method of a sputtering method, a plasma-CVD method or the like can be adopted.

Next, a first amorphous semiconductor film 12 is formed in close contact with the base film 11. Here, the amorphous silicon film 12 is formed as an amorphous semiconductor film. As a forming method, a publicly-known film forming method of a sputtering method, a plasma CVD method, a low pressure CVD method or the like can be adopted.

Further, a thickness of the first amorphous semiconductor film 12 comprising an amorphous semiconductor can be set to 50 nm through 100 nm. Because the first amorphous semiconductor film 12 is crystallized and finally constitutes a source region or a drain region of TFT and therefore, when the thickness is excessively thin, sheet resistance of the source or the drain region is increased. Further, the thickness is preferably set to be equal to or larger than 50 nm in order to increase an orientation rate of {111} as mentioned later since when the film is thin, a margin for crystallization becomes very narrow.

Next, a mask film 13 is formed for selectively adding a metal element for reducing crystallization energy of a semiconductor to the first amorphous semiconductor film 12. As the mask film 13, since the mask film 13 is removed later, a film having etching selectivity with the first amorphous semiconductor film 12 is preferable and a resist or an insulating film of silicon oxide, silicon nitride or the like can be used.

Further, the mask film 13 is provided with an opening portion 13a in a groove-like shape (slit-like shape) and a metal element is added to the amorphous semiconductor film 12 via the opening portion 13a. Although a size of the groove of the opening portion 13a is not particularly limited, the width may be set to 10 through 40 μm and a length in a longitudinal direction thereof may arbitrarily be set in accordance with circuit arrangement. Further, the shape of the opening portion 13a is not limited to the groove-like shape but can arbitrarily be determined such as a spot-like shape.

Refer to FIG. 2

Next, in order to add the metal element, by using a spinner, a solution including nickel is coated on an entire surface of the substrate to thereby form a nickel layer 14. As the solution, a solution produced by dissolving a metal salt of nickel acetate, nickel nitrate or the like in water or ethanol can be used. A method of coating the solution is useful in view of the fact that the concentration of the metal element to be added can easily be constituted by controlling the concentration of the solution.

When the solution is coated by using the spinner, a solvent is dried by rotating the spinner and nickel dissolved in the solution remains on an entire flat of the substrate to thereby form the nickel layer 14. Therefore, although it seems that the thickness of the nickel layer 14 is about that of a single atom layer and a complete film is not constituted, it is known that an expected effect can be achieved when nickel atoms can be brought into contact with the surface of the first amorphous semiconductor film 12.

However, the amorphous silicon repels water and therefore, when an aqueous solution is coated, the solution cannot uniformly be coated and therefore, wettability of the surface may be improved by forming an oxide film of about several nm on the surface of the first amorphous semiconductor film 12 comprising amorphous silicon-exposed at the opening portion 13a of the mask film 13.

When the oxide film is extremely thin, the metal element of nickel or the like passes through the oxide film and can selectively be brought into contact with the first amorphous semiconductor film 12 at the area 12a.

According to a method of forming the oxide film, in consideration of throughput and process temperature, a method of forming the oxide film in a short period of time at low process temperature is pertinent, such as a method of irradiating UV light in an oxidizing atmosphere of ozone or oxygen or a method of coating an aqueous solution including ozone on the surface of the area 12a of the amorphous silicon film 12 by the spinner.

Refer to FIG. 3

Under a state in which the mask film 13 is present, a heating treatment is carried out to thereby crystallize the first amorphous semiconductor film 12 and form a first crystalline semiconductor film 16.

In the heating treatment, a heating furnace utilizing resistors is used. In the case of crystallizing the amorphous silicon film by Ni, the heating treatment is carried out at temperature of 400 through 700° C., preferably, 500 through 600° C. for 4 through 24 hours.

In the case of crystallizing an amorphous semiconductor whose component is silicon and including germanium, or an amorphous silicon film including about 1 atomic % through 10 atomic % of germanium, it is necessary to make heating temperature more or less higher than that in the case of the amorphous silicon film and temperature is set to 500 through 700° C., preferably, 550 through 600° C.

Or, the heating treatment may be carried out in the heating apparatus of RTA type utilizing a high power lamp of an arc lamp, a halogen lamp or the like. Further, in the heating apparatus of RTA type, there can also be adopted a method of growing crystals by making a heating area by the arc lamp or the halogen lamp linear and moving the heating area relative to the substrate from the area 12a added with nickel in a direction of intended crystal growth similarly to the case of laser beam.

First, in crystallization, a silicide is formed by reaction of the metal element to silicon by the heating treatment at 400 through 500° C., the silicide constitutes crystal nuclei and contributes to crystal growth thereafter. Nickel silicide (hereinafter described as $NiSi_2$) is formed. The structure of $NiSi_2$ is a fluorite structure which is a structure arranged with nickel atoms among silicon lattices of a diamond-type structure. When nickel atoms are removed from $NiSi_2$, silicon crystal remains. It has been found from a result of numerous experiments that nickel atoms are moved to a side of amorphous silicon and the reason seems to be that solubility of nickel atoms in amorphous silicon is higher than that in crystal silicon.

Accordingly, there can be established a model in which as if nickel atoms were moved in the first crystalline semiconductor film (amorphous silicon film) 12 while forming nickel silicide 14 to thereby form crystalline silicon 16'.

Refer to FIG. 4

A described above, by selectively adding the metal element, the first amorphous semiconductor film 12 comprising amorphous silicon is crystallized by so-to-speak lateral growth and a first crystalline semiconductor film 16 comprising crystalline silicon is formed. After the heating treatment, the mask film 13 is removed.

The first crystalline semiconductor film 16 comprising crystalline silicon is crystallized by selectively adding the metal element as described above and therefore, orientation of crystal grains can be aligned and it has been known by experiments that there is constituted a film having the highest rate of {111} among crystal s of {001}, {101} and {111}. In other words, this can be described such that there is constituted a film having the largest rate of crystal grains in which a crystal axis thereof in a direction of a normal line of the surface of the substrate (surface of the first crystalline semiconductor film 16) indicates <111>.

Further, an explanation will later be given of orientation of crystal by using measured data along with Embodiment 2.

Further, by irradiating continuous wave laser beam, pulse laser beam or infrared beam after crystallizing the first amorphous semiconductor film 12, crystal defects remaining in crystal grains of the first crystalline semiconductor film 16 can be reduced.

Figure 5:
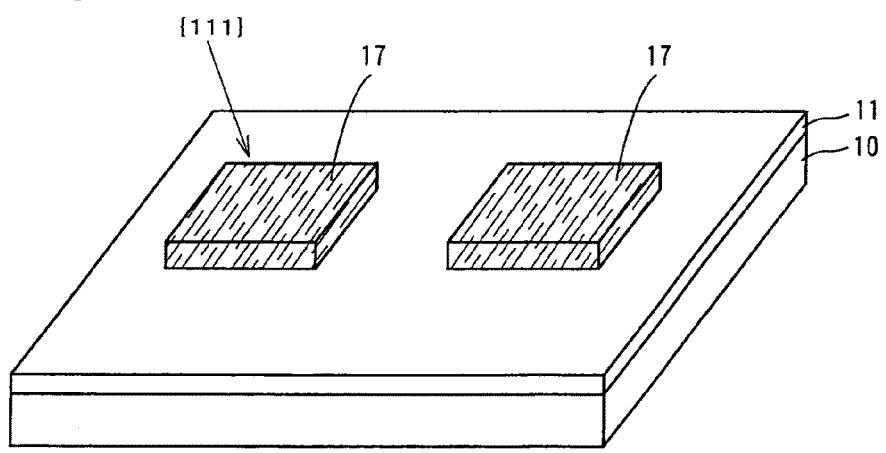
FIG. 5 is a view continued from FIG. 4 showing the method of forming the first crystalline semiconductor layer (Embodiment 1)

Refer to FIG. 5

The first crystalline semiconductor film 16 is patterned in a predetermined shape by etching to thereby form a pair of first crystalline semiconductor layers 17 for constituting a source region and a drain region of TFT. However, nickel is included with high concentration at the area 12a constituting a start point of crystal growth and an area of a finish end of crystal growth. Therefore, since it is not preferable that the areas are used in a semiconductor element, the first crystalline semiconductor layer 17 is patterned such that the areas are not included.

Refer to FIG. 6A

Next, there is formed a second amorphous semiconductor film 18 comprising an amorphous semiconductor in close contact with the first crystalline semiconductor layer 17. Here, an amorphous silicon film is formed. Further, as a film forming method, a publicly-known method of a sputtering method or a plasma CVD method can be adopted.

A thickness of the second amorphous semiconductor film 18 is set to 10 nm through 60 nm, preferably, 20 nm through 30 nm. The second amorphous semiconductor film is crystallized and finally becomes a channel forming region of a thin film transistor and therefore, by thinly forming the second amorphous semiconductor film 18 to be equal to or smaller than 60 nm, a thickness of the channel forming region is thinned and an effect of suppressing a leakage current value in an OFF state or an effect of increasing an ON current/OFF current ratio can be expected.

Refer to FIG. 6B, FIG. 6C

Next, a second amorphous semiconductor layer 19 is formed by patterning the second amorphous semiconductor film (amorphous silicon) 18 by etching while leaving a region for constituting TFT. Further, two of the first crystalline semiconductor layers 17 are respectively formed to be larger than the pattern of the second amorphous semiconductor layer 19 and therefore, the first crystalline semiconductor film 17 is also patterned by a mask used for the etching.

As illustrated, the second amorphous semiconductor layer 19 is patterned to include a region overlapped with the first crystalline semiconductor layer 17 and a region 19a which is not overlapped with the first crystalline semiconductor layer 17 and is a region for constituting the channel forming region of TFT. FIG. 6B is a top view and FIG. 6C is a sectional view taken along a line x-x' of FIG. 6B.

Refer to FIGS. 7A through 7C

As shown by FIG. 7A, continuous wave laser beam is irradiated such that an irradiated region 21 thereof is moved from a region overlapped with the first crystalline semiconductor layer 17 to a region 19a which is not overlapped with the first crystalline semiconductor layer 17 relative to the substrate 10 in a direction in parallel with a channel length direction.

By irradiating continuous laser beam to a total of the second amorphous semiconductor layer 19 while moving the irradiated region 21 relative to the substrate as described above, the total of the second amorphous semiconductor layer 19 is crystallized to thereby form a second crystalline semiconductor layer 22.

The irradiated region 21 produced by the continuous wave laser beam is always irradiated with the laser and therefore, in the irradiated region, the second amorphous semiconductor layer 19 is melted and an interface of a molten portion (liquid phase)—an unmolten portion (solid phase) is formed in a plane in a direction parallel to the surface of the second amorphous semiconductor layer 19. Therefore, it seems that when the irradiated region 21 is moved, in accordance with the movement, the interface of liquid phase—solid phase is moved and a previously melted portion is cooled and solidified. By such a procedure, the second amorphous semiconductor layer 19 is crystallized. Therefore, in the second amorphous semiconductor layer 19, crystals grow in a direction of moving the molten portion (corresponding to the irradiated region) and crystal grains having a shape elongated in a horizontal direction of a surface of the substrate 10 (surface of the second amorphous semiconductor layer 19) can be made to grow (so-to-speak lateral growth).

In order to irradiate the continuous wave laser beam to the total of at least one of the second crystalline semiconductor layers 19 by moving the irradiated region 21 by once along the channel length direction, beam (light flux) of the continuous wave laser beam is enlarged in one direction to become a beam having a long axis as illustrated. Although a shape of the beam is illustrated to be a rectangular shape having four rounded corners in FIG. 7A, the shape may be a long elliptic shape, a linear shape or a rectangular shape.

Further, irradiation of the continuous wave laser beam is not limited to irradiation while moving in a moving direction of an arrow mark only by once but includes irradiation while reciprocating along the channel length direction or moving in one direction designated by a white arrow mark by a plural number of times.

As described above, in crystallization by the continuous wave laser beam, crystals grow by melting the semiconductor and therefore crystallizing performance of the provided crystalline semiconductor depends on crystallizing performance of a crystalline semiconductor for constituting a seed.

Therefore, in a region (a region which is not overlapped with the first crystalline semiconductor layer 17) 22a of the second crystalline semiconductor layer 22, crystals grow with the first crystalline semiconductor layer 17 as seeds and therefore, a crystal structure thereof grows to copy a crystal structure of the first crystalline semiconductor layer 17.

According to a crystal of the first crystalline semiconductor layer 17, a rate of being oriented to {111} is the largest and therefore, in the crystal structure of the second crystalline semiconductor layer 22 in the region 22a, an orientation rate of {111} is the highest among {001}, {101} and {111}, and a crystal plane can be aligned to {111}.

Refer to FIG. 7D

FIG. 7D is an outline perspective view of the region 22a in the crystalline semiconductor layer 22.

According to the embodiment, it is possible to make the film thickness of the second amorphous semiconductor film to be crystallized equal to or smaller than 60 nm and make a crystal growth distance of crystal grains sufficiently longer than a length in the channel length direction of the region 22a for constituting a channel forming region and therefore, the embodiment is characterized in that although a grain boundary GB in parallel with the channel length direction which is the crystal growth direction is present in the region 22a, the grain boundary is not present in a channel width direction.

It is known that by crystallization by the continuous wave laser beam, a single crystal can grow up to a distance of about 100 μm through 150 μm in the direction of moving the laser beam, however, when the film thickness of the semiconductor film to be crystallized becomes thin, it is very difficult to prolong the crystal growth distance.

In the case of the embodiment, even when the film thickness is thinned to be equal to or smaller than 60 nm, since crystals grow by constituting the seed by the first crystalline semiconductor layer 17 at the region 22a, a nuclei generating position can be controlled and further, in the case of an element such as TFT, normally, a size of the region 22a is a size of about channel length×channel width, which is at least about ten and several μm square and therefore, as described above, in the region 22a, it is facilitated that although the grain boundary GB is present in the channel length direction in parallel with the crystal growth direction, the grain boundary is not present in the channel width direction.

Further, the region 22a of the second crystalline semiconductor layer 22 is constituted by a single crystal grain in the film thickness direction and therefore, at the region 22a, the crystal grain boundary can be reduced and further, as described above, the grain boundary GB is formed only in the channel length direction in parallel with the crystal growth direction.

Such a crystal growth can be realized by optimizing an energy density provided to the semiconductor by the continuous wave laser beam, by controlling an output of the continuous wave laser beam, moving speed of the irradiated region, an area and a width in the moving direction of the irradiated area and the like.

Further, energy of crystallization may be reduced by providing the semiconductor layer with heat energy, electromagnetic energy or the like by heating the substrate or irradiating microwave when the continuous wave laser beam is irradiated.

By the above-described steps, the first and the second crystalline semiconductor layers for constituting an active layer of a thin film transistor are formed. Thereafter, a thin film transistor can be formed in accordance with a publicly-known method of fabricating a top gate type thin film transistor.

Figure 8A:
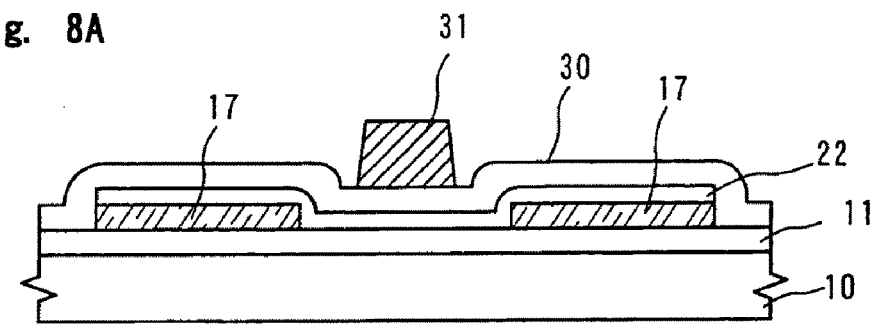
FIGS. 8A, 8B and 8C are views continued from FIGS. 7A, 7B, 7C and 7D showing steps of forming a thin film transistor (Embodiment 1)

Refer to FIG. 8A

For example, a gate insulating film 30 is formed on the second crystalline semiconductor layer 22 and a gate electrode 31 is formed on the gate insulating film 30.

Figure 8B:
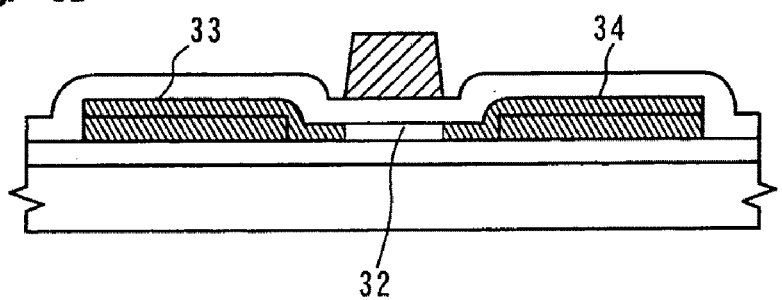

Refer to FIG. 8B

An impurity is doped to the first and the second crystalline semiconductor layers 17 and 22 with the gate electrode 31 as a mask. When an N-channel type thin film transistor is formed, P (phosphor) is doped and when a P-channel type thereof is formed, B (boron) is doped. As a result, a channel forming region 32, a source region 33 and a drain region 34 are formed in a self aligning manner at the active layer constituted by laminating the first and the second crystalline semiconductor layers 17 and 22.

Figure 8C:
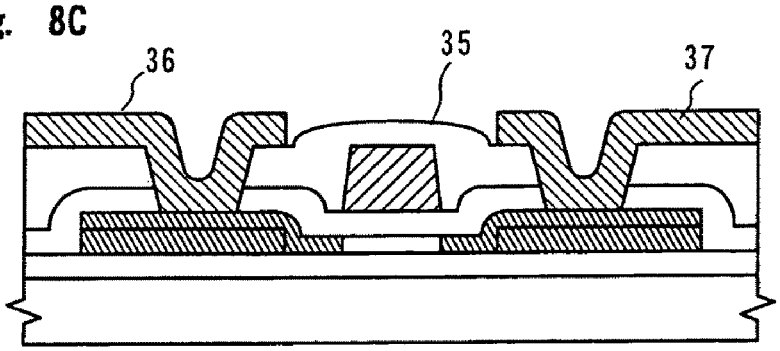

Refer to FIG. 8C

An interlayer insulating film 35 is formed on the gate electrode 31. In order to connect the source region 33 and the drain region 34 to electrodes or wirings, contact holes are formed in the interlayer insulating film 35 and a source electrode 36 and a drain electrode 37 are formed to thereby finish a thin film transistor.

The source region 33 and the drain region 34 are provided in portions in which the first crystalline semiconductor layer 17 and the second crystalline semiconductor layer 22 are laminated. The channel forming region 32 is provided in the region 22a in which the second crystalline semiconductor layer 22 is not overlapped with the first crystalline semiconductor layer 17. The above-described constitution is common to cases of fabricating a top gate type TFT, and a bottom gate type TFT such as inversely staggered TFT.

According to the thin film transistor of the embodiment, the second crystalline semiconductor layer 22 for constituting the channel forming region 32, is formed such that the crystal grain boundary becomes parallel with the channel length direction and a grain boundary hampering movement of carriers is eliminated and therefore, the field effect mobility of the thin film transistor can be increased.

Further, the second crystalline semiconductor layer for constituting the channel forming region is aligned to {111} and therefore, even when a number of thin film transistors are fabricated on the same substrate, crystal orientations of channel forming regions of respective elements are aligned and therefore, a variation in characteristics of respective elements can be restrained.

Further, even in the case of a thin channel forming region of about 10 through 40 nm, the crystal orientation can be aligned as described above and therefore, not only the field effect mobility is increased but also the threshold voltage value and the sub threshold characteristic can be improved.

Embodiment 2

According to Embodiment 1, the crystal orientation of the first crystalline semiconductor film is predominantly oriented to {111} by selectively adding the metal element. In contrast thereto, according to the embodiment, an explanation will be given of a method of forming a first crystalline semiconductor film predominantly oriented to {101} by using a silicon film added with germanium as a first amorphous semiconductor film.

Figure 9:
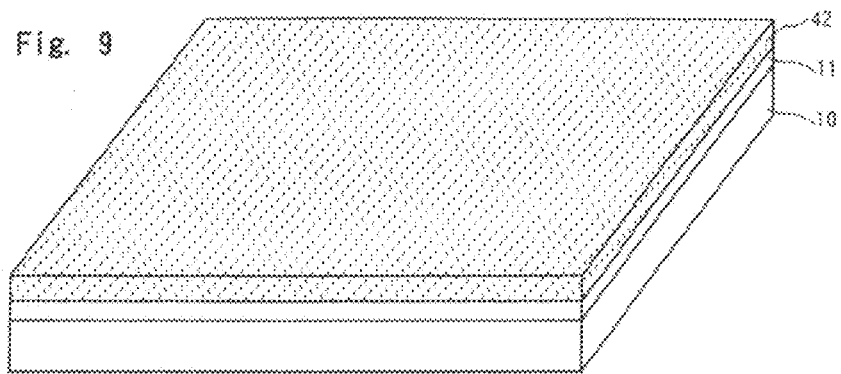
FIG. 9 is a perspective view showing a method of forming a first crystalline semiconductor film (Embodiment 2)
Figure 10:
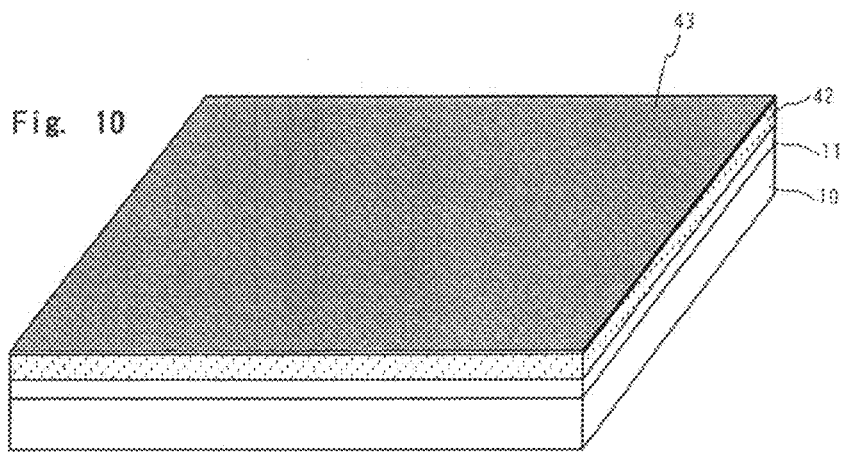
FIG. 10 is a view continued from FIG. 9 showing the method of forming the first crystalline semiconductor film (Embodiment 2)

Refer to FIG. 9

First, similarly to Embodiment 1, the base film 11 is formed on the substrate 10 and a silicon film 42 added with amorphous germanium is formed on the base film 11 as a first amorphous semiconductor film. As a method of forming the silicon film 42, a publicly-known film forming method of a sputtering method, a plasma CVD method, a low pressure CVD method or the like can be adopted.

When the plasma CVD method is applied, a reaction gas comprising $SiH_4$ and $GeH_4$, or a reaction gas comprising $GeH_4$ diluted by $SiH_4$ and $H_2$ is added and introduced into a reaction chamber and decomposed by high frequency discharge of 1 through 200 MHz to thereby deposit an amorphous semiconductor film over the substrate. As the reaction gas, $Si_2H_6$ or $SiF_4$ may be adopted in place of $SiH_4$ and $GeF_4$ may be adopted in place of $GeH_4$.

The same reaction gas may be used also in the case of using the low pressure CVD method and it is preferable to use a reaction gas diluted by He. Further, it is preferable to form an amorphous semiconductor film at temperature of 400 through 500° C.

In the embodiment, according to the film whose major component is silicon including germanium which is the first amorphous semiconductor film 42, in order to increase an orientation rate of {101}, a content of germanium falls in a range of 1 atomic % through 10 atomic %, preferably, 1 through 5 atomic %. In the case of the CVD method, the content of germanium can be controlled by, for example, a flow rate ratio (partial pressure) of $SiH_4$ and $GeH_4$ used as the reaction gas. Further, in the case of using the sputtering method, the content of germanium can be controlled by a concentration of germanium included in a target or a flow rate of $GeH_4$ including germanium used for the reaction gas.

A metal element for reducing crystallization energy of silicon is added to an entire surface of the first amorphous semiconductor film 42 and a layer including the metal element is formed on the surface of the first amorphous semiconductor film 42. In this case, an aqueous solution of nickel acetate is coated by using a spinner to thereby form a nickel layer 43.

Further, the first amorphous semiconductor film 42 may be formed after forming the nickel layer 43 by coating a nickel solution on the surface of the base film 11 as described above before forming the first crystalline semiconductor film 42.

Figure 11:
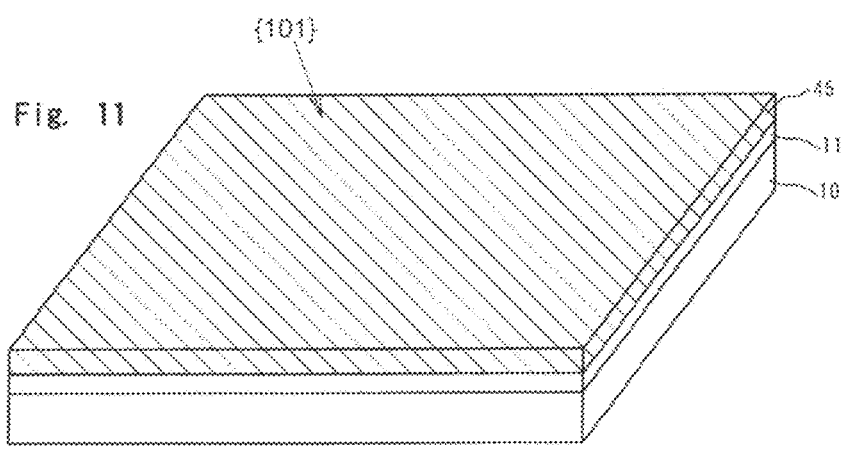
FIG. 11 is a view continued from FIG. 10 showing the method of forming the first crystalline semiconductor film (Embodiment 2)

Refer to FIG. 11

After introducing the metal element, by crystallizing the amorphous semiconductor film by utilizing the metal element, a first crystalline semiconductor film 45 predominantly oriented to {101} can be formed. Crystallization can be carried out by a heating treatment using a heating furnace or irradiation of strong beam of laser beam or ultra violet beam or infrared beam.

Although the heating treatment can be carried out in a range of 500 through 700° C., with respect to an upper limit of temperature, heat resistant temperature of a substrate used is taken into account as an upper limit. In the case of a glass substrate, a strain point or lower thereof constitutes a basis. Further, as an upper limit of temperature, temperature at which accidental spontaneous nuclei are not generated in the first amorphous semiconductor film 42 is taken into account. A temperature at which crystal growth is progressed only by a reaction of the metal element and silicon is set as described above.

Although a mechanism of providing a crystalline silicon film having a high orientation rate of {101} plane by adding a metal element for crystallization as described above and including germanium in an amorphous silicon film, is not clear at present stage, the following prediction can be made.

As explained in Embodiment 1, in the case of crystallizing an amorphous silicon film by using nickel, nickel silicide ($NiSi_2$) is formed by reaction of nickel and silicon by a heating treatment at about 400 through 600° C. It seems that $NiSi_2$ becomes crystal nuclei and contributes to crystal growth thereafter and [111] plane minimizes interface energy of $NiSi_2$ and crystal silicon and therefore, a surface in parallel with a plane of the crystalline silicon film becomes [101] plane and the lattice plane is predominantly oriented.

However, when a crystal growth direction is a direction in parallel with the surface of the substrate and crystals grow in a columnar shape, a degree of freedom is provided to a rotational direction with the columnar crystal as an axis and therefore, {101} planes are not necessarily oriented and according to our experiment, silicon crystal grains are highly oriented to {111} plane as shown by Embodiment 1.

Accordingly, it has been found that according to the embodiment, in order to improve orientation of {101} lattice planes of the first crystalline semiconductor film, by adding about 1 atomic % through 10 atomic % of germanium to amorphous silicon for giving a restriction to the rotational direction of the columnar crystal to thereby reduce the degree of freedom, an orientation rate to {101} can be made to be equal to or larger than 20%.

It is known that when about 1 atomic % through 10 atomic % of germanium is included in amorphous silicon, a density of generating crystal nuclei is reduced. It is predicted that when NiSi$_2$ constituting crystal nuclei is formed, the above-described crystal growth is brought about while excluding germanium from NiSi$_2$ by a difference between an interatomic distance of silicon and nickel and an interatomic distance of germanium and nickel.

Therefore, according to the prediction, it seems that germanium included in a silicon film is present in a state of being precipitated to an outer side of a silicon crystal and germanium under such a state reduces a degree of freedom in the rotational direction of the crystal axis in a direction of a normal line of the substrate with respect to the silicon crystal. It seems that {111} plane minimizing the interface energy of NiSi$_2$ and crystal silicon is the least and therefore, the plane in parallel with the surface of the crystalline silicon film becomes {101} plane and the lattice planes are predominantly oriented.

Refer to FIG. 12

A first crystalline semiconductor film 45 predominantly oriented to {101} is formed. Steps thereafter may be carried out similarly to Embodiment 1. A pair of first crystalline semiconductor layers 46 are formed by patterning the first crystalline semiconductor film 45 in a predetermined shape. The pair of first crystalline semiconductor layers 46 respectively constitute a source region and a drain region.

Refer to FIG. 13A, 13B

A second amorphous semiconductor layer 47 is formed by forming an amorphous semiconductor film of amorphous silicon in contact with the first crystalline semiconductor layer 46 and patterning the amorphous semiconductor film in a predetermined shape similarly to Embodiment 1. Further, FIG. 13A is a top view and FIG. 13B is a sectional view taken along a line x-x' of FIG. 13A.

Refer to FIGS. 14A, 14B

Similarly to Embodiment 1, a second crystalline semiconductor layer 48 is formed by crystallizing a total of the second amorphous semiconductor layer 47 by irradiating continuous wave laser beam thereto such that the irradiated region 21 is moved relative to the substrate 10 from a region overlapped with the first crystalline semiconductor layer 46 to a region 47a which is not overlapped with the first crystalline semiconductor layer 46 in a direction in parallel with a channel length direction.

Irradiation of the continuous wave laser beam is not limited to irradiation only by once but includes also a case of irradiation by a plural number of times, In this case, the continuous wave laser beam may be moved to reciprocate along the channel length direction or moved by a plural number of times in one direction.

Refer to FIGS. 14B, 14C

Accordingly, the second crystalline semiconductor layer 48 is crystallized with the first crystalline semiconductor layer 46 as a seed, including a region 48a thereof which is not overlapped with the first crystalline semiconductor layer 46 and therefore, it is possible that crystals grow to copy a crystal structure of the first crystalline semiconductor layer 46 to constitute a crystalline semiconductor having the highest rate of {101} among crystal planes of {001}, {101} and {111}.

Refer to FIG. 14D

FIG. 14D is an outline perspective enlarged view of the region (which is the region which is not overlapped with the first crystalline semiconductor layer 46) 48a of the second crystalline semiconductor layer 48. As explained in Embodiment 1, even in the case in which the second amorphous semiconductor layer 47 is as thin as 10 through 60 nm, it is possible that in the second crystalline semiconductor layer 48 crystallized by the continuous wave laser beam, at least in the region 48a for constituting a channel forming region, the grain boundary GB is present in parallel with the channel length direction which is the crystal growth direction, the grain boundary is not present in the channel width direction.

The first and the second crystalline semiconductor layers for constituting an active layer of a thin film transistor are formed by the above-described steps. Thereafter, the thin film transistor can be formed in accordance with the publicly-known method of fabricating a top gate type thin film transistor as shown by Embodiment 1. Naturally, a bottom gate type thin film transistor can also be fabricated by forming a gate electrode before forming the first and the second crystalline semiconductor layers.

According to the thin film transistor using the first and the second crystalline semiconductor layers for the active layer, similarly to Embodiment 1, the second crystalline layer for constituting the channel forming region is formed such that the crystal grain boundary is in parallel with the channel length direction and a grain boundary hampering movement of carriers is eliminated and therefore, the field effect mobility of the thin film transistor can be increased.

Further, according to the embodiment, the second crystalline semiconductor layer 48 for constituting the channel forming region is aligned to {101} and therefore, even when a number of thin film transistors are fabricated on the same substrate, crystal orientations of channel forming regions can be aligned for respective elements and therefore, a variation in characteristics of the respective elements can be suppressed.

Particularly, even in a thin channel forming region of about 10 through 40 nm, the orientation can be aligned to {101} as described above and therefore, not only the field effect mobility can be increased but also the threshold voltage value and the sub threshold characteristic can be improved.

Further, the embodiment is characterized in that the channel forming region is predominantly oriented to {101} as shown in the beginning. It is known that generally, holes are major carriers in a P-channel type TFT and therefore, it is more difficult to increase the field effect mobility than in an N-channel type TFT, however, a mobility of hole becomes the highest at {101} crystal plane and an effect of capable of further increasing the field effect mobility of the P-channel type TFT can be expected by the embodiment.

(With Regard to Orientation of First Crystalline Semiconductor Film)

A description will be given here of the first crystalline semiconductor films formed by the methods of Embodiments 1 and 2 with regard to orientations of the crystal grains by using a standard triangle provided by the above-described EBSP method (FIGS. 36A, 36B, 36C, 37).

Figure 35A:
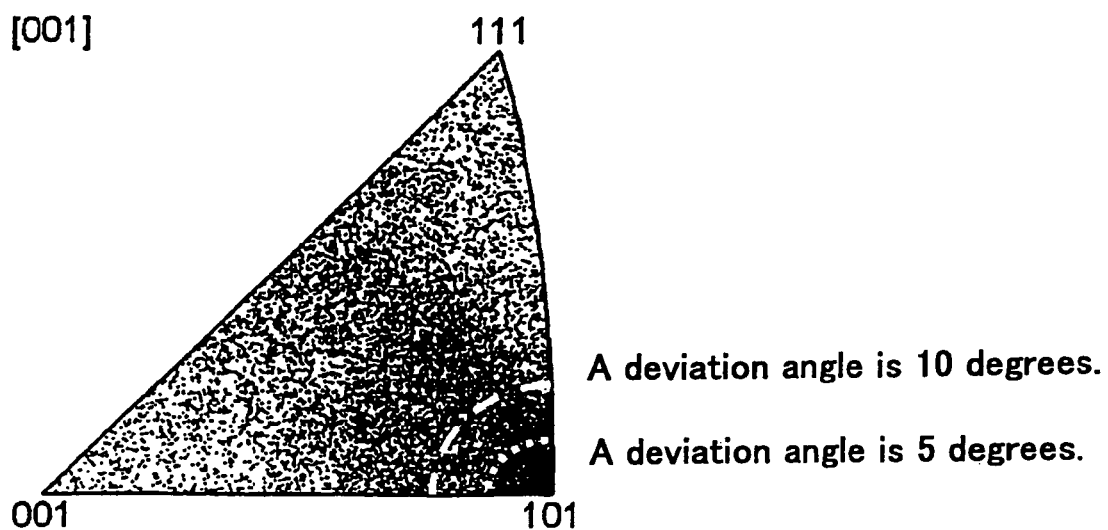
FIGS. 35A and 35B are explanatory views of a standard triangle provided from EBSP data.
Figure 35B:
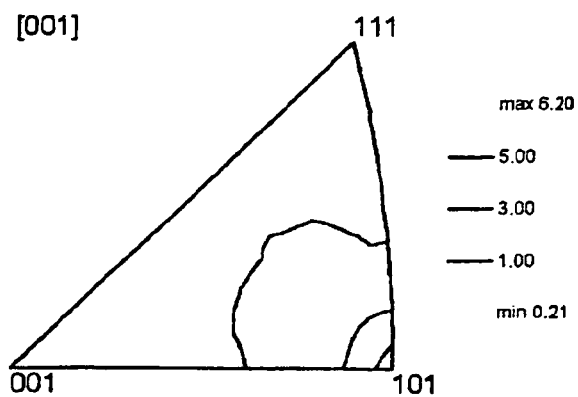

Further, an explanation has been given of the standard triangle in reference to FIGS. 35A and 35B and FIG. 35B displays a distribution of orientation by contour lines and FIGS. 36A, 36B and 36C and FIG. 37 displays the distribution by contour lines similarly to FIG. 35B and the contour lines are shown by color (concentration).

Numerical value indicating the concentration of the standard triangle is referred to as "times random" showing a multiple for the case of assuming a literally random orientation. That is, with a point density in, the case of uniformly distributing all the measured points in the standard triangle as a reference, and what multiplication factor thereof is constituted by an inverse pole degree of actual data is shown. Therefore, in the case of a numerical value larger than 1, predominant orientation is provided. Further, the rate of the orientation rate indicates a rate to a number of all the measured points.

A standard triangle of FIG. 36A is for the crystalline semiconductor film according to Embodiment 1 and a standard triangle of FIG. 36B is for the crystalline semiconductor film of Embodiment 2.

According to a method of fabricating a sample of FIG. 36A, a base film comprising silicon oxide is formed on a glass substrate and an amorphous silicon film which does not include germanium (Ge) is formed on the base film as a first amorphous semiconductor film. The amorphous silicon film is formed by a plasma CVD apparatus and $SiH_4$ is used as a reaction gas. A flow rate of $SiH_4$ is set to 100 sccm. In order to selectively add a metal element, a mask film comprising silicon oxide is formed and an aqueous solution of nickel acetate having a nickel concentration of 10 ppm is selectively coated. Heating conditions for crystallization are temperature of 570° C. and heating time of 14 hours.

It can easily be understood from the standard triangle of FIG. 36A that crystal grains are oriented to {111} plane most predominantly in the sample of Embodiment 1.

According to a method of fabricating a sample of FIG. 36B, an amorphous silicon film including germanium is formed by a CVD apparatus on a quartz substrate as a first crystalline semiconductor film. $GeH_4$ diluted by $SiH_4$ and $H_2$ is used as a reaction gas. With respect to a flow rate of the reaction gas, a flow rate of $SiH_4$ is 100 sccm and a flow rate of $GeH_4$ diluted by $H_2$ is 10 sccm. In order to add a metal element, an aqueous solution of nickel acetate having a nickel concentration of 10 ppm is coated on an entire surface of the film. For crystallization, after heating for 1 hour at temperature of 500° C., the film is further heated for 4 hours at 580° C.

It can easily be understood from the standard triangle of FIG. 36B that the sample of Embodiment 2 tends to orient most strongly dominantly to {101}. Further, it can easily be understood by comparing data of FIGS. 36A and 36B that by adding germanium, {101} orientation is predominantly brought about in the crystalline silicon film. According to the illustrated example, a film showing a high orientation rate of 60% can be provided.

Further, although quartz is used in the substrate of the sample of FIG. 36B, in the case of a sample using a glass substrate and formed with a silicon oxide film as a base film thereof, by constituting a nickel concentration of an aqueous solution of nickel acetate to be 0.1 ppm, {101} orientation rate can be made to be equal to or larger than 60%.

It is known by experiment that the orientation rate of {101} is changed by the concentration of nickel added to the amorphous silicon film.

An amorphous silicon film including germanium is formed over a glass substrate via a matrix film, a nickel concentration of an aqueous solution of nickel acetate is changed, other condition is made to stay the same and a change of {101} orientation rate (angle of allowable value=10 degrees) is investigated. When the nickel concentration is 0.1 ppm, the orientation rate is about 60%, when the nickel concentration is 1 ppm, the orientation rate is about 50%, when the nickel concentration is 10 ppm, the orientation rate is about 30% and when the nickel concentration is 30 ppm, the orientation rate is about 20%.

Therefore, it is known that there is a tendency that the smaller the added nickel, the higher the {101} orientation rate.

Further, it is also known by experiment that in the example of Embodiment 2, the orientation rate of {101} of the crystalline silicon film including germanium depends on the concentration of germanium.

An amorphous silicon film including germanium is formed over a glass substrate via a base film, a nickel concentration of an aqueous solution of nickel acetate is made to be 10 ppm, a flow rate of $GeH_4$ diluted by $H_2$ in forming the amorphous silicon film is changed, other condition is made to stay the same and a change in {101} orientation rate is investigated. As a result, when a flow rate of $GeH_4$ diluted by $H_2$ is 5 sccm, 10 sccm and 15 sccm, respective {101} orientation rate (angle of allowable value=10 degrees) is about 20%, about 30%, and about 20%.

Therefore, although depending on an added amount of nickel and a kind of a substrate used, in order to make {101} orientation equal to or larger than 20% in the case in which the angle of the allowable value is within 10 degrees, it is preferable to make the concentration of germanium in the silicon film equal to 1 atomic % or larger and equal to or lower 10 atomic %.

FIG. 36C shows a standard triangle with regard to a crystalline silicon film according to Reference Example 1. Although the nickel acetate solution is selectively coated in FIG. 36A (Embodiment 1), in the reference example, the nickel acetate solution is coated on the entire surface of the amorphous silicon film to thereby crystallize the amorphous silicon film.

It is known that since the sample of Reference Example 1 is a crystalline silicon film crystallized by adding nickel, the sample tends to orient to {111}. However, as is known by comparing the standard triangles of FIGS. 36A and 36C, according to Reference Example 1, the orientation rate of {111} becomes a lower value of 14% compared with about 49% in the sample of Embodiment 1.

Therefore, it is known that an effect of increasing {111} orientation rate is achieved by adding a metal element and constituting lateral growth by making the added portion selective.

Figure 37:
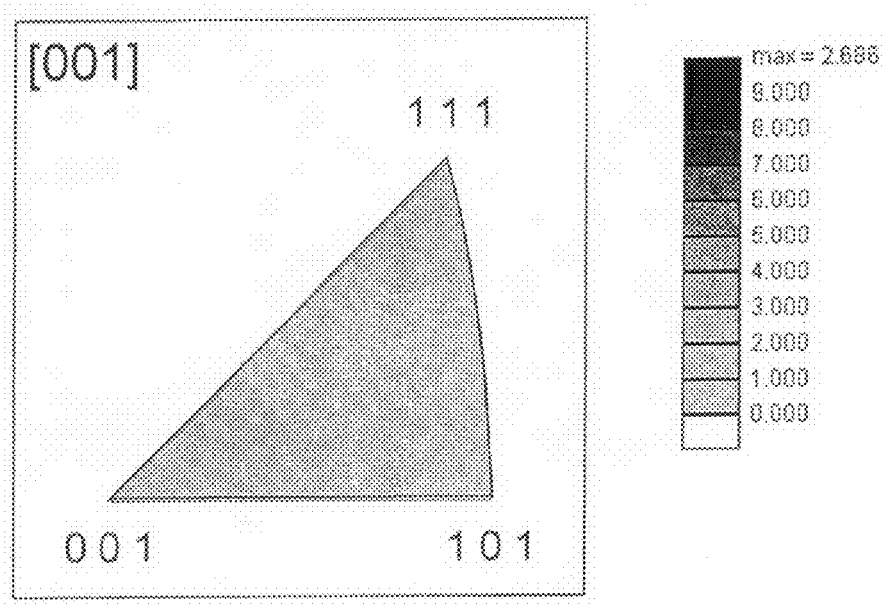
FIG. 37 shows a standard triangle of the first crystalline semiconductor layers of Embodiment 1, Embodiment 2 and Reference example 1.

Refer to FIG. 37

Further, FIG. 37 shows a standard triangle with respect to a crystalline silicon film of Reference Example 2 and is a standard triangle of a polycrystal silicon film referred to as so-to-speak polysilicon. This is a sample produced by heating an amorphous silicon film on a quartz substrate for 20 hours at 600° C.

It is known that the polycrystal silicon film of Reference Example 2 is not oriented predominantly to any of {111}, {101} and {001} but there is not anisotropy in crystalline performance and random orientation is constituted.

Therefore, it can easily be understood by comparing FIGS. 36A and 36B and FIG. 37 that by adding a metal element and including germanium in an amorphous silicon film, there is achieved an effect of orienting the film to a specific plane orientation present on a crystal plane of a crystallized silicon film.

Embodiment 3

According to the example, an explanation will be given of an example of forming a lower layer of a first crystalline semiconductor layer by irradiating continuous wave laser and crystallizing an upper layer of a second amorphous semiconductor layer with the first crystalline semiconductor layer as a seed by irradiating continuous wave laser beam.

Figure 15:
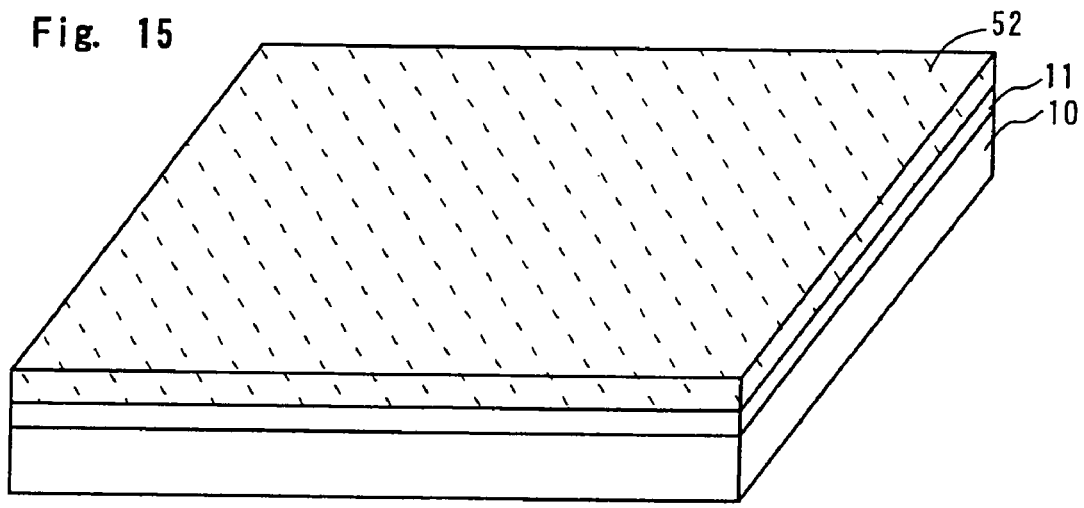
FIG. 15 is a perspective view showing a method of forming the first crystalline semiconductor film (Embodiment 2)

Refer to FIG. 15

First, similarly to Embodiment 1, the base film 11 is formed on the substrate 10 and an amorphous silicon film 52 is formed on the base film 11 as a first amorphous semiconductor film. As a forming method, a publicly-known film forming method of a sputtering method, a plasma CVD method or a low pressure CVD method can be adopted.

Figure 16:
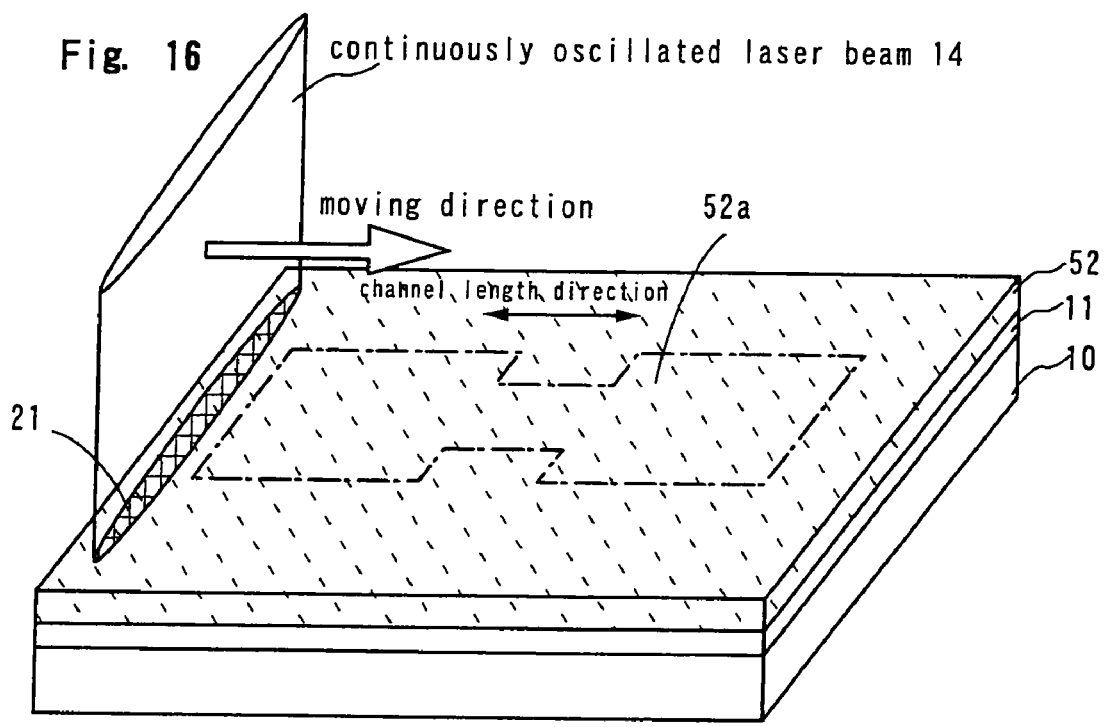
FIG. 16 is a view continued from FIG. 9 showing a method of forming a first crystalline semiconductor layer (Embodiment 3)

Refer to FIG. 16

Next, the first amorphous semiconductor film 52 is crystallized by irradiating continuous wave laser beam. Laser beam is irradiated while moving the irradiated region 21 produced by the continuous wave laser beam relative to the substrate 10 in a direction of an arrow mark. In FIG. 16, a region 52a shown by one-dotted chain lines of the first amorphous semiconductor film 52 is an element region to be formed with a thin film transistor, showing an outer shape of a second crystalline semiconductor layer, mentioned later.

As described above, crystals grow in accordance with movement of the irradiated region 21 of the continuous wave laser beam and therefore, a crystal grain having a grain size elongated in the horizontal direction (lateral direction) can be made to grow on a flat surface of the substrate. Further, it is known that when the continuous wave laser beam is used, the film is not oriented to a specific plane orientation as in Embodiment 1 or 2, however, there is a tendency in which the <100> axis is liable to grow with respect to the direction of moving the irradiated region 21.

Further, similarly to the case of the embodiment, in irradiating the laser beam, beam (light flux) of the continuous wave laser beam 14 is enlarged in one direction to constitute beam of long axis as illustrated such that a total of at least the region 52a is irradiated by moving the irradiated region 21 by once in one direction.

Although a shape of beam is a long elliptic shape in FIG. 16, the shape may be a linear shape, a rectangular shape or a rectangular shape having rounded four corners.

Further, according to the embodiment, irradiation of the continuous wave laser beam is not limited to irradiation while moving in an arrow mark moving direction by once. The irradiation include irradiation by reciprocating along one direction shown by an arrow mark or irradiation by moving in the one direction shown by the arrow mark by a plural number of times.

Figure 17:
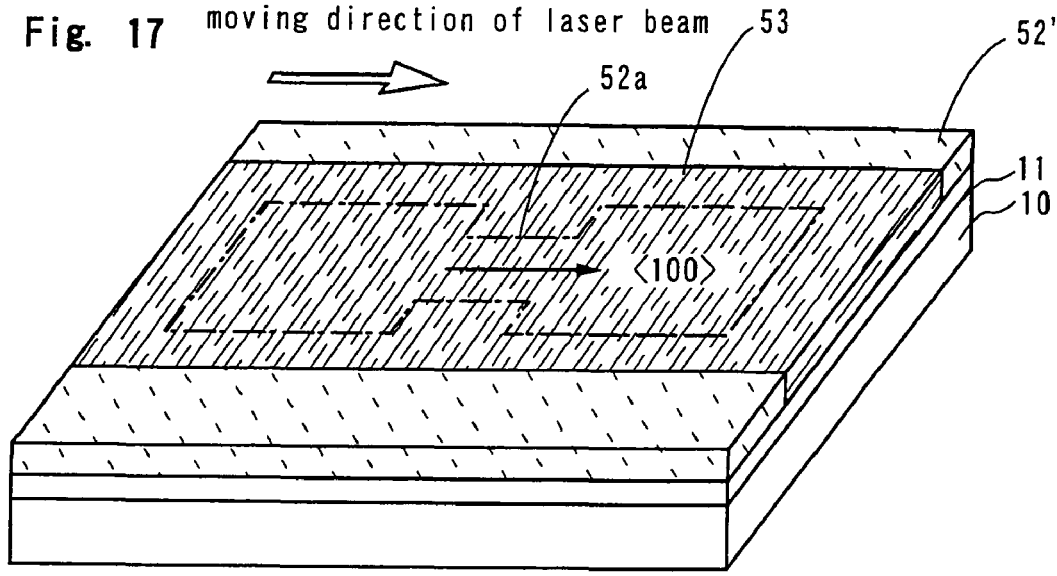
FIG. 17 is a view continued from FIG. 10 showing the method of forming the first crystalline semiconductor layer (Embodiment 3)

Refer to FIG. 17

Further, it is not necessary to crystallize an entire surface of the first amorphous semiconductor film 52 but a crystalline semiconductor 53 may be constituted by crystallizing at least the region 52a for constituting the first crystalline semiconductor layer.

Figure 18:
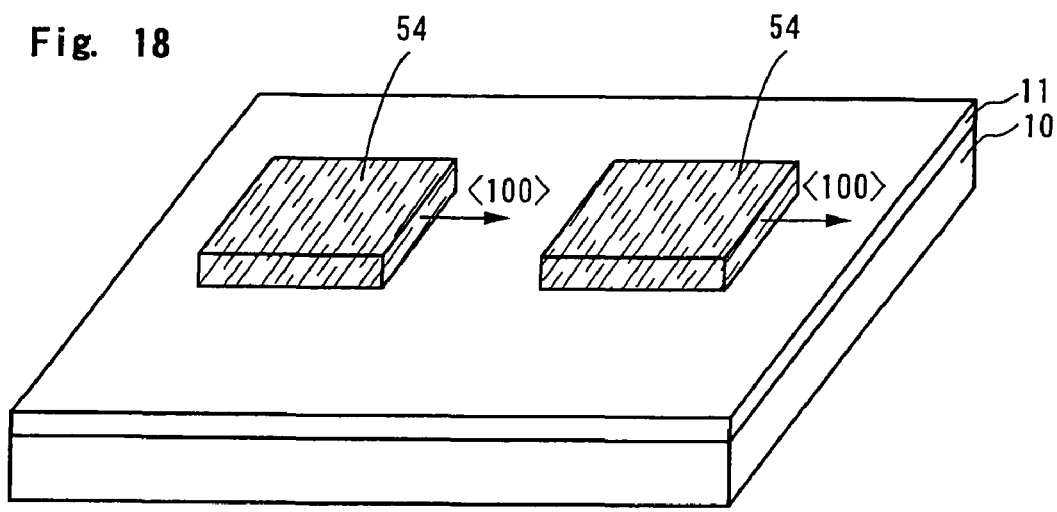
FIG. 18 is a view continued from FIG. 11 showing the method of forming the first crystalline semiconductor layer (Embodiment 3)

Refer to FIG. 18

When crystallization by the continuous wave laser beam is carried out, the crystallized region 53 is patterned by etching into a predetermined shape and two of the first crystalline semiconductor layers 54 comprising crystalline silicon are formed. The first crystalline semiconductor layers 54 are seed crystals for crystallizing a channel forming region of a thin film transistor and also is a layer for constituting a source region and a drain region of the thin film transistor.

Since crystal growth in the horizontal direction, or so-to-speak lateral growth has been carried out on the surface of the substrate, as described above, according to a crystal structure of the first crystalline semiconductor layer 54, a single crystal grain is constituted in the film thickness direction and the crystal grains are constituted by a shape elongated in the direction of moving the continuous wave laser beam.

The thickness of the first amorphous semiconductor film 52 to be crystallized is made to be equal to or larger than 30 nm, preferably, equal to or larger than 50 nm. This is because the first crystalline semiconductor layer for finally constituting an element is a portion for constituting a source region and a drain region and the film thickness to some degree is needed in order to prevent contact resistance with an electrode or a wiring at the portion from increasing. Further, because when the film is thin, a margin of a condition of irradiating continuous wave laser beam in crystallizing is narrowed.

Further, an upper limit of the film thickness of the first amorphous semiconductor film 52 is set to be equal to or smaller than 400 nm, preferably, equal to or smaller than 150 nm such that a thickness of melting a total of the film is constituted in the irradiated region of the continuous wave laser beam.

Figure 19A:
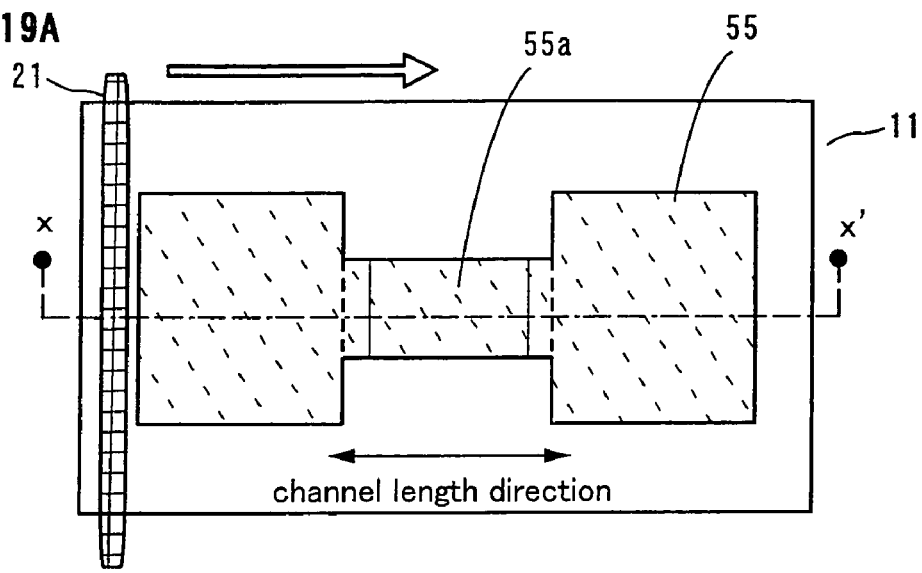
FIGS. 19A and 19B are views continued from FIG. 18 showing a method of forming a second crystalline semiconductor layer (Embodiment 3)
Figure 19B:
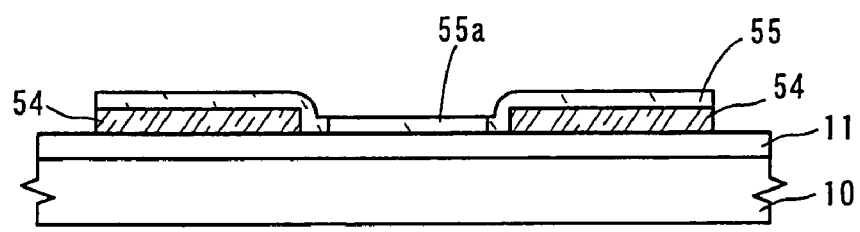

Refer to FIGS. 19A, 19B

Next, there is formed a second amorphous semiconductor film comprising an amorphous semiconductor in close contact with the first crystalline semiconductor layer 54. In this case, an amorphous silicon film is formed. Further, a second amorphous semiconductor layer 55 is formed similarly to Embodiment 1 by patterning the second amorphous semiconductor film in a predetermined shape. A region 55a which is not overlapped with the first crystalline semiconductor layer 54 of the second amorphous semiconductor layer 55 is a region for constituting a channel forming region.

Similarly to Embodiment 1 or 2, the thickness of the second amorphous semiconductor film 55 is set to be equal to or smaller than 60 nm, preferably 10 nm through 60 nm, more preferably, 20 nm through 30 nm. The second amorphous semiconductor film is a film finally constituting a channel forming region of a thin film transistor by being crystallized. By thinly forming the film thickness of the second amorphous semiconductor film to be about 10 nm through 60 nm, the thickness of the channel forming region is thinned and an effect of restraining a leakage current value in an OFF state and an effect of increasing an ON current/OFF current ratio are achieved.

Figure 20A:
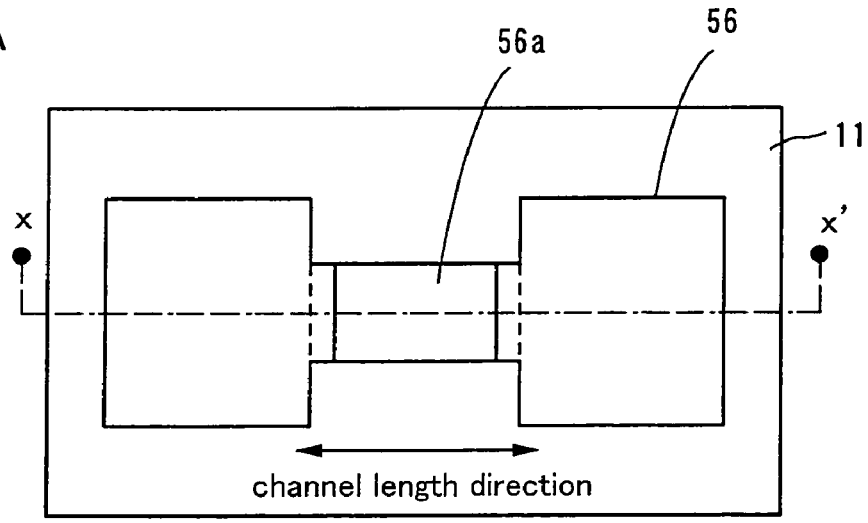
FIGS. 20A and 20B are views continued from FIGS. 19A and 19B showing the method of forming the second crystalline semiconductor layer (Embodiment 3)
Figure 20B:
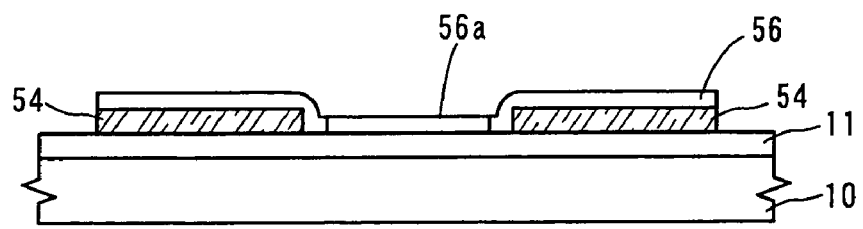

Refer to FIGS. 20A, 20B

Further, similar to the case of crystallizing the first amorphous semiconductor film 52, by irradiating the second amorphous semiconductor film while moving the irradiated region 21 produced by the continuous wave laser beam relative to the substrate 10 along the channel length direction, a total of a second amorphous semiconductor layer 55 is crystallized and a second crystalline semiconductor layer 56 is formed.

In the second crystalline semiconductor layer 56, a channel forming region of a thin film transistor is provided in a region 56a which is not overlapped with the first crystalline semiconductor layer 54. Also according to the embodiment, the second crystalline semiconductor layer 56 is formed by using the continuous wave laser beam and therefore, it is possible that the grain boundary of the region 56a is present only in the channel length direction in parallel with the crystal growth direction and the crystal grain boundary in the channel width direction is not present.

Refer to FIG. 21

An explanation will be given of crystallization of the second amorphous semiconductor layer 54 in reference to FIG. 21.

Similarly to Embodiments 1 and 2, the continuous wave laser beam is irradiated to the second amorphous semiconductor layer 54 while moving the irradiated region 21 from a region overlapped with the first crystalline semiconductor layer 54 to the region 55a which is not overlapped with the first crystalline semiconductor layer 54 relative to the substrate 10 in the direction in parallel with the channel length direction.

It is known that according to the first crystalline semiconductor layer 54 of the embodiment, different from Embodiments 1 and 2, although the plane orientation is random, <100> axis is liable to emerge in the crystal growth direction. By paying attention to the point, according to the embodiment, in carrying out lateral growth in the second amorphous semiconductor layer by using the continuous wave laser beam, by arranging the side surface 54a having anisotropy in crystallinity of the first crystalline semiconductor layer can contribute to crystal growth of the region 55a for constituting the channel forming region, a crystal axis <100> of the region 55a corresponds to the direction of moving the irradiated region (channel length direction). Hence, in crystallizing the first and the second amorphous semiconductor films, the direction of moving the irradiated region of the continuous wave laser beam is aligned to the channel length direction.

By the above-described steps, the first and the second crystalline semiconductor layers 54 and 56 for constituting an active layer of a thin film transistor are formed. Thereafter, a thin film transistor may be formed as explained in, for example, Embodiment 1 in accordance with a publicly-known method of fabricating a top gate type thin film transistor. Naturally, a bottom gate type thin film transistor can be formed by previously forming a gate electrode and forming the first and the second crystalline semiconductor layers.

Embodiment 4

According to Embodiment 3, in forming the first crystalline semiconductor layer, there is adopted the method of crystallizing the predetermined region of the first amorphous semiconductor film 52 comprising the amorphous semiconductor and thereafter patterning the predetermined region by etching.

In contrast to the forming method, it is possible to previously pattern the first amorphous semiconductor film 52 in the predetermined shape by etching and thereafter crystallizing the first amorphous semiconductor film 52 by irradiating the continuous wave laser beam while moving in a constant direction similarly to Embodiment 3 to thereby form the first crystalline semiconductor layer.

Embodiment 5

Although according to the above-described embodiment, the shape of the first crystalline semiconductor layer is made to be cubic, according to the invention, the shape of the first crystalline semiconductor layer is not limited to a cubic shape so far as the second amorphous semiconductor layer can be crystallized with the first crystalline semiconductor layer as a seed. According to the embodiment, a modified example of the shape of the first crystalline semiconductor layer will be shown.

Figure 22A:
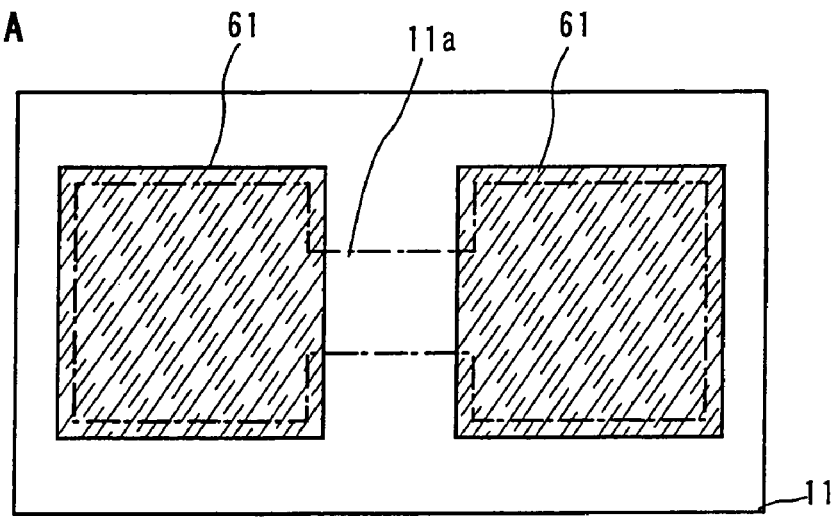
FIGS. 22A, 22B, 22C and 22D are views showing a method of forming a first crystalline semiconductor layer (Embodiment 5)

Refer to FIG. 22A

First, as explained in Embodiment 1 or 2, a first crystalline semiconductor layer 61 is formed over the substrate 10 via the matrix film 11. Further, a region 11a of the matrix film 11 shown by one-dotted chain lines shows a contour of a second crystalline semiconductor layer to be formed later. Also according to the embodiment, similarly to the above-described embodiment, the first crystalline semiconductor layer 61 is widened to extrude from the second crystalline semiconductor layer.

Figure 22B:
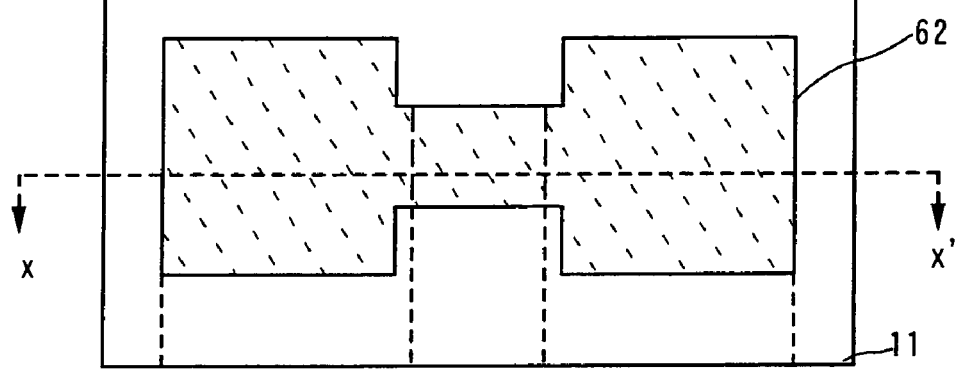
Figure 22C:
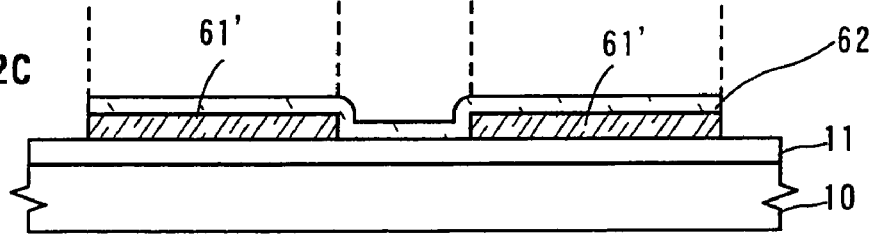
Figure 22D:
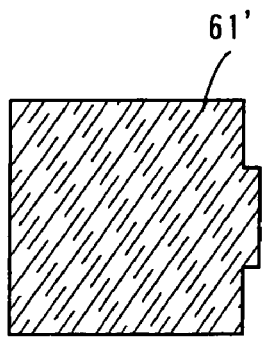

Refer to FIGS. 22B, 22C, 22D

Next, there is formed an amorphous silicon film as a second amorphous semiconductor film over an entire surface of the substrate 10 in close contact with the first crystalline semiconductor layer 61. By a publicly-known method, a mask comprising a resist is formed, by using the mask, the second amorphous semiconductor film is etched to a predetermined shape to thereby form a second amorphous semiconductor layer 62 and also the first crystalline semiconductor layer 61 is etched.

FIG. 22C is a sectional view taken along a line x-x' of FIG. 22B and FIG. 22D is a top view of the first crystalline semiconductor layer 61'. Thereafter, as explained in Embodiments 1 through 3, the second crystalline semiconductor layer is formed by crystallizing the second amorphous semiconductor layer 62 by using the continuous wave laser beam. A thin film transistor may be fabricated by forming a channel forming region, a source region and a drain region from laminated first and second crystalline semiconductor layers.

Generally, according to a semiconductor layer of a thin film transistor, a width of the channel forming region is narrower than those of the source region and the drain region. Hence, the embodiment is characterized in that a width of a crystal for constituting a seed is made slender in accordance with the channel width. By forming the first crystalline semiconductor layer 61' in this way, in the channel forming region, an effect of restraining crystal growth which is not in line with the channel length direction is expected and therefore, a crystal orientation in the channel forming region can be aligned further reproducibly.

Figure 23A:
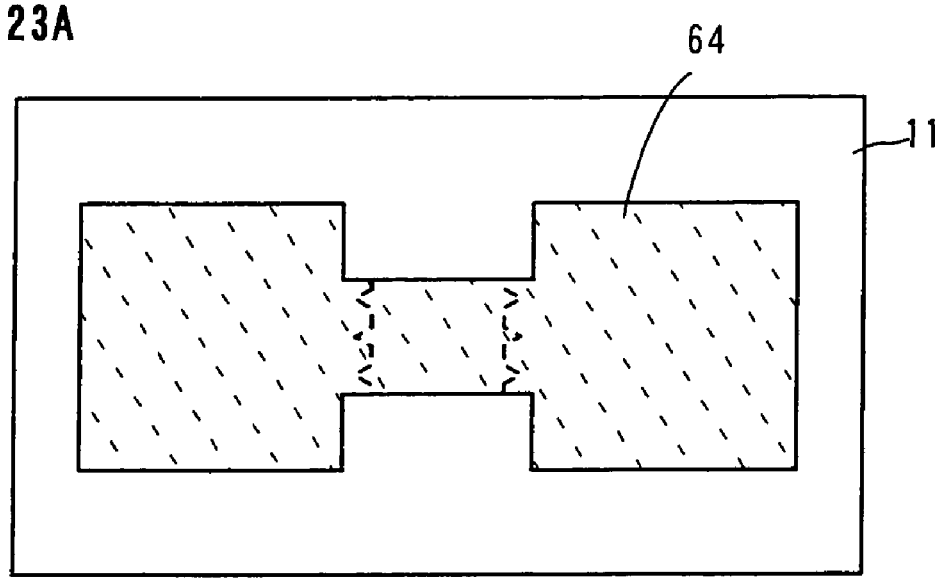
FIGS. 23A and 23B are views showing the method of forming the first crystalline semiconductor layer (Embodiment 5)
Figure 23B:
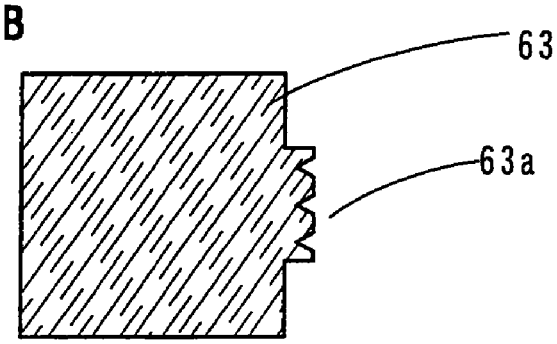

Next, FIGS. 23A and 23B show an example of providing recesses and projections at a side surface of the first crystalline semiconductor layer in contact with the second amorphous semiconductor layer. In FIGS. 23A and 23B, notations the same as those of FIGS. 22A, 22B, 22C and 22D indicate same constituent elements. FIG. 23A shows a state of forming the first crystalline semiconductor layer 63 and the second crystalline semiconductor layer 64 in correspondence with FIG. 22B.

FIG. 23B is a top view of the first crystalline semiconductor layer 63. As illustrated, the side surface of the first crystalline semiconductor layer 63 is formed with recesses and projections in the shape of a saw tooth. By forming the recesses and projections, it can be expected that crystal growth is predominantly brought about from the side surface of the first crystalline semiconductor layer 63 and therefore, the shape is particularly effective in the cases of embodiments 3 and 4.

Further, the shape of the side surface is not limited to the shape illustrated in FIGS. 23A and 23B but recesses and projections in a shape of a triangular wave, a rectangular wave, a sine wave or a circular arc can be added.

Embodiment 6

FIGS. 24A, 24B, 24C, 24D

Although an explanation has been given of an example of using the continuous wave laser beam for forming the upper layer of the second crystalline semiconductor layer according to Embodiments 1 through 3, mentioned above, according to the invention, in place of the continuous wave laser beam, pulse laser beam can also be used. According to the embodiment, an explanation will be given of a method of using pulse laser beam.

Refer to FIG. 24A

Here, the embodiment will be explained with a process explained in Embodiment 1 as an example. Similarly to Embodiment 1, steps up to FIGS. 6A, 6B and 6C are carried out. That is, a pair of first crystalline semiconductor layers 71 are formed over the substrate 10 via the base film 11 and a second amorphous semiconductor layer 72 is formed in contact with the first crystalline semiconductor layer 71. A region 72a of the second crystalline semiconductor layer is a region for forming a channel forming region of a thin film transistor.

Further, by moving an irradiated region of pulse laser beam relative to the substrate 10 in a constant direction, the pulse laser beam is irradiated to a total of the second amorphous semiconductor layer 72 to thereby form a second crystalline semiconductor layer 74. A region 74a of the second crystalline semiconductor layer 74 corresponds to the region 72a of the second crystalline semiconductor layer 72.

Refer to FIG. 24B

The pulse laser beam is irradiated while moving an irradiated region 73 of the pulse laser beam in a direction in parallel with the surface of the substrate 10 and orthogonal to the channel length direction. The irradiated region 73 includes both of a region of the second amorphous semiconductor layer 72 overlapped with the first crystalline semiconductor layer 71 and the region 72a thereof which is not overlapped with the first crystalline semiconductor layer 71.

This is because solid phase—liquid phase interface cannot be moved as in the continuous wave laser beam since an irradiating time period is about several through several tens nano second which is much shorter than that of the continuous wave laser beam. Hence, the first crystalline semiconductor layer 71 for constituting a seed of crystal growth is always included in the irradiated region 73 which is a region melted by the pulse laser beam.

By irradiating the pulse laser beam while moving the pulse laser beam as described above, in the irradiated region 73, crystal growth can be carried out always from only the first crystalline semiconductor layer 71 and the crystal growth direction can be made to be in parallel with the channel length direction. That is, by controlling the nucleus generating position and the crystal growth direction, the second amorphous semiconductor layer 72 can be subjected to lateral growth to copy the crystal structure of the first crystalline semiconductor layer 71.

Refer to FIG. 24D

Further, crystals grow in the region 74a of the second crystalline semiconductor layer 74 from respective ones of the pair of first crystalline semiconductor layers 71 and therefore, there are formed a plurality of grain boundaries GB1 formed in the channel length direction in parallel with the crystal growth direction and a single crystal grain boundary GB2 formed by collision of grain boundaries which have grown with the different first crystalline semiconductor layers 71 as seeds to each other. Further, the region 74a comprises a single crystal grain in the film thickness direction.

In order to make crystals grow in this way, the crystal growth can be realized by optimizing a given energy density by controlling an output of the pulse laser beam, moving speed of the irradiated region, an area of the irradiated region, a width in the moving direction and the like. Further, when the pulse laser beam is irradiated, a part of energy of crystallization may be provided by heat energy, electromagnetic energy or the like to the semiconductor layer in order to heat the substrate or irradiate microwave.

After having been processed by the above-described steps, the first and the second crystalline semiconductor layers for constituting an active layer of a thin film transistor are formed. Thereafter, a thin film transistor may be formed in accordance with a publicly-known fabricating method.

Further, a grain boundary such as the grain boundary GB2 in parallel with the channel width direction can be prevented from being included in the channel forming region by devising a circuit constitution as in Embodiment 7, mentioned later.

Embodiment 7

In the case of Embodiment 6, due to crystallization by pulse laser beam, the grain boundary GB2 in the channel width direction is formed in the second crystalline semiconductor layer. However, influence of the grain boundary can be eliminated by designing an element such that the grain boundary is not included in the channel-forming region.

Figure 25A:
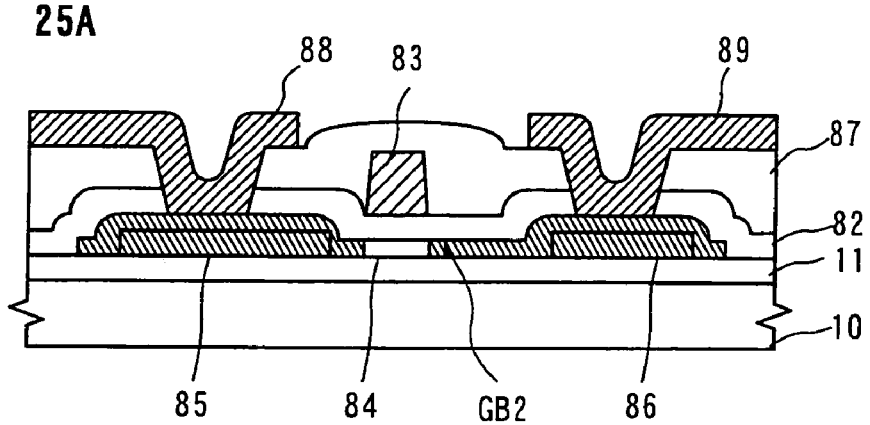
FIGS. 25A and 25B are sectional views of a thin film transistor Embodiment 7.

Refer to FIG. 25A

For example, by providing a first crystalline semiconductor layer constituting a source region 85 and a drain region 86 asymmetrically in the left and right direction, a grain boundary GB2 of a second crystalline semiconductor layer can be prevented from being included in a channel forming region 84.

Further, in FIG. 25A, numeral 10 designates the substrate, numeral 11 designates the base film, numeral 82 designates a gate insulating film, numeral 83 designates a gate electrode, numeral 87 designates an interlayer insulating film, numeral 88 designates a source electrode and numeral 89 designates a drain electrode.

Figure 25B:
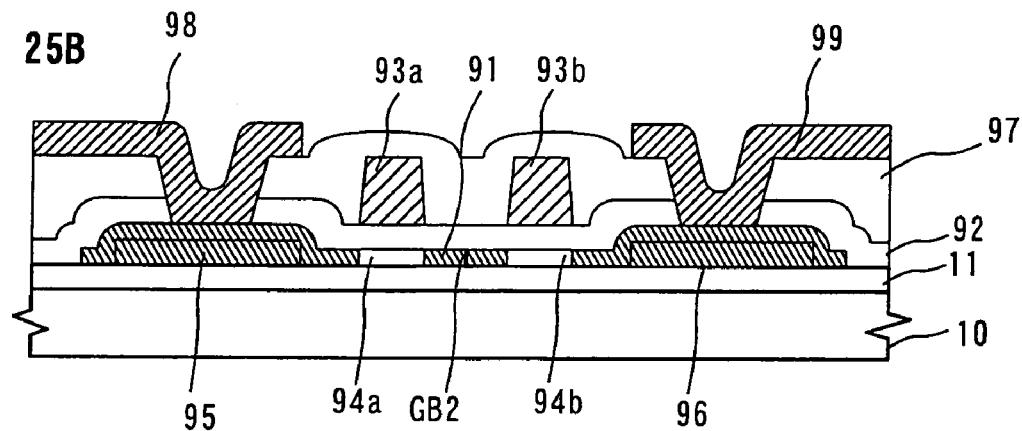

Refer to FIG. 25B

Further, by constituting a multichannel structure in which a single channel forming region of a thin film transistor is divided by two or more, the channel length can be increased and the structure can be formed to avoid the grain boundary GB2.

In FIG. 25B, numeral 10 designates the substrate, numeral 11 designates the matrix film, numeral 92 designates a gate insulating film, notations 93a and 93b designate gate electrodes, notations 94a and 94b designate channel forming regions, numeral 95 designates a source region comprising a first and a second crystalline semiconductor layer and numeral 96 designates a drain region similarly constructed. A region 91 is an impurity region for connecting two of the channel forming regions 94a and 94b and an element may be designed such that the grain boundary GB2 is included in the impurity region. Numeral 97 designates an interlayer insulating film, numeral 98 designates a source electrode and numeral 99 designates a drain electrode.

Embodiments 1 through 7 described above, can pertinently be combined. For example, the method of forming the first crystalline semiconductor layer and the second amorphous semiconductor layer shown in Embodiment 3 is applicable to other embodiment. The thin film transistor is not limited to the top gate type but the invention is applicable to a thin film transistor of a bottom gate type, representatively, an inverse stagger type.

Embodiment 8

The semiconductor apparatus according to the invention is not limited to a semiconductor element such as a thin film transistor. The invention includes a general semiconductor apparatus using an integrated circuit comprising an element using the first and the second crystalline semiconductor layers according to the invention such as a thin film transistor and the like. For example, an active matrix type liquid crystal panel or an active matrix type electroluminescence panel is a representative example of a semiconductor device utilizing the thin film transistor.

Further, the semiconductor apparatus of the invention includes electronic apparatus mounted with the active matrix type display device, such as a portable telephone, a personal digital assistance (PDA), a notebook type personal computer, a display for a personal computer, a television set and so on.

EXAMPLES

Examples of the invention will be explained in reference to FIG. 26 through FIG. 34H.

Example 1

FIG. 26 through FIG. 31B

According to the embodiment, an explanation will be given of an example of carrying out the invention in an active matrix type liquid crystal panel having a pixel portion and a drive circuit on a same substrate.

Figure 26:
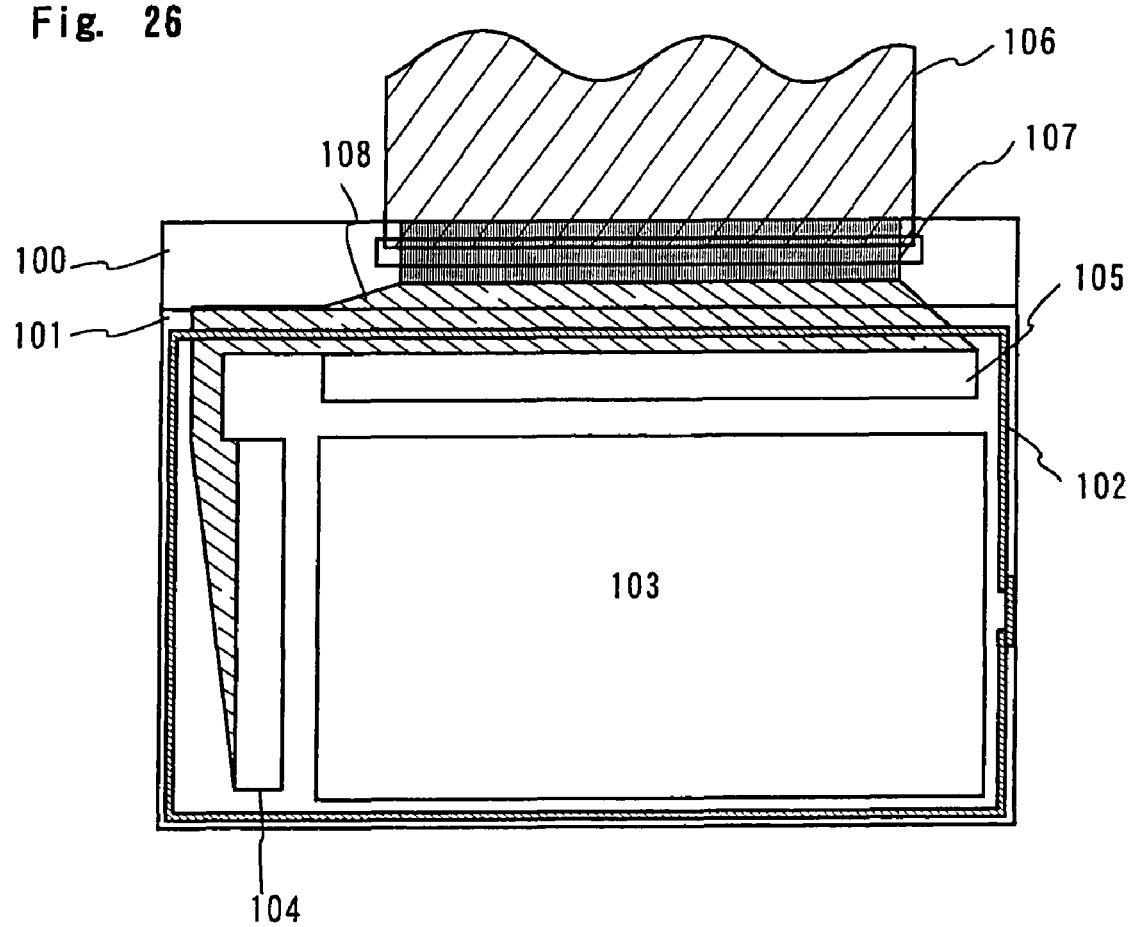
FIG. 26 is an outline view showing a constitution of an active matrix type liquid crystal panel (Example 1)

(Refer to FIG. 26) FIG. 26 is an outline view of an active matrix type liquid crystal panel. According to the liquid crystal panel, surroundings of two sheets of substrate 100 and 101 are sealed by a seal member to interpose liquid crystals. The substrate 100 is a substrate generally referred to as a TFT (Thin Film Transistor) array substrate. The substrate 100 is provided with a pixel portion having TFTs as switching elements and a gate line drive circuit 104 and a source line drive circuit 105 which are integrated circuits constituted by TFTs or the like. Further, there are provided an external input terminal 107 pasted with a flexible printed circuit (FPC) 106 and a wiring 108 for connecting input portions of the drive circuits 104 and 105 and the external connection terminal 107.

The other substrate 101 is a substrate generally referred to as opposed substrate. The substrate 101 is provided with an opposed electrode (not illustrated) to be opposed to the pixel portion 103 and is provided with an alignment film for aligning liquid crystals on the opposed electrode as necessary. In the case of a panel which can display images with colors, a color filter is provided at a portion thereof opposed to the pixel portion 103.

Figure 27:
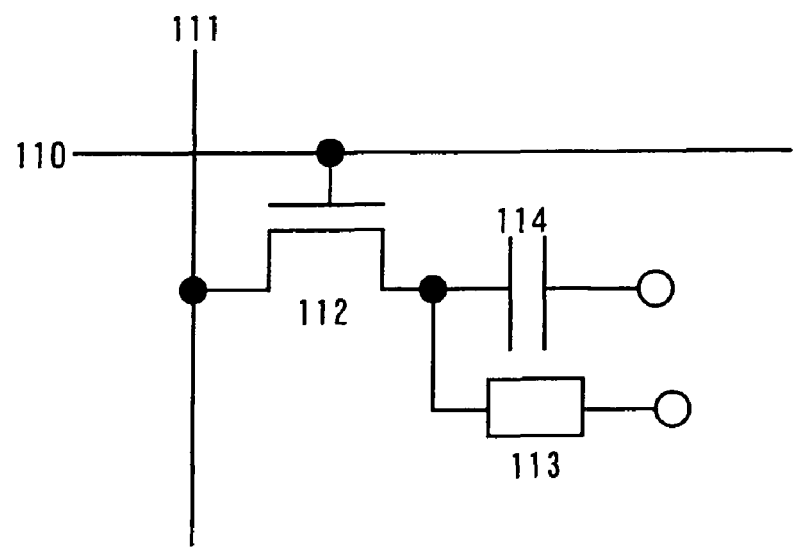
FIG. 27 is an equivalent circuit diagram of a pixel portion of the active matrix type liquid crystal panel (Example 1)
Figure 28:
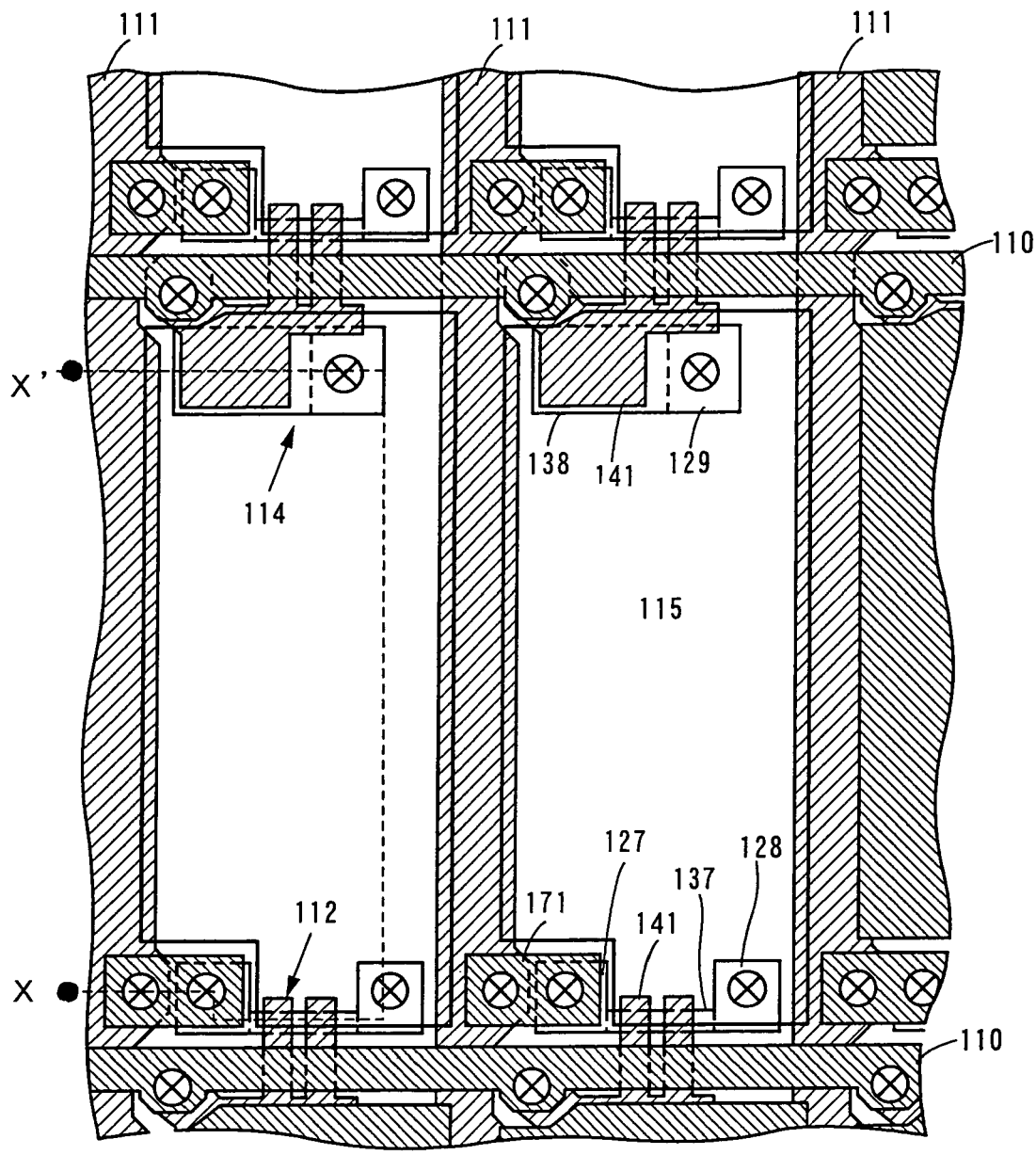
FIG. 28 is a top view of the pixel portion of the active matrix type liquid crystal panel (Example 1)

(Refer to FIG. 27, FIG. 28) FIG. 27 shows an equivalent circuit of an element. FIG. 28 is a top view of the pixel portion of the substrate 100. A pixel is provided with a gate line 110 to which a signal is transmitted from the gate line drive circuit 104 and a source line 111 to which a signal is transmitted from the source line drive circuit 105 to intersect with each other. The intersected portion is provided with a thin film transistor 112, a liquid crystal element 113 and a capacitor 114. The liquid crystal element 113 becomes a capacitor by constituting electrodes by a pixel electrode 115 connected to the pixel TFT 112 and an opposed electrode 101 (not illustrated) provided at the opposed substrate and constituting a dielectric by liquid crystals. The capacitor 114 is an element for supplementing capacitance of the liquid crystal element 113.

An explanation will be given of a method of fabricating the substrate in reference to FIG. 29A to FIG. 31B. Further, the drive circuits 104 and 105 are representatively fabricated by a process of fabricating a thin film transistor of a CMOS type constituting a basis of the circuit for convenience of explanation. Further, in FIG. 29A through FIG. 31B, upper views thereof designate sectional views of a CMOS type TFT and lower views thereof show sectional views of a pixel portion, which are sectional views taken along a line X-X' of FIG. 28.

Figure 29A:
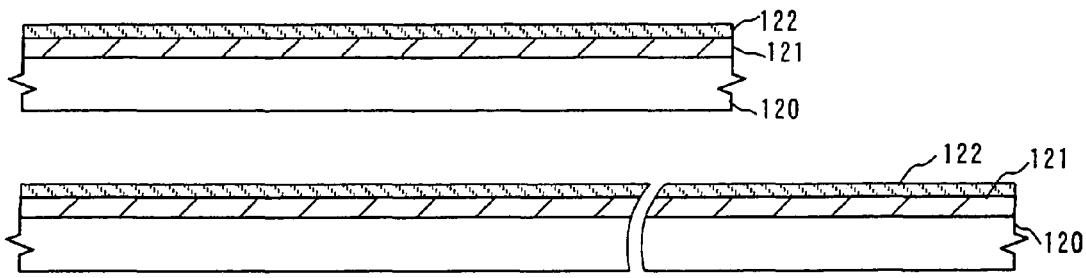
FIGS. 29A, 29B and 29C are sectional views showing a method of fabricating a TFT array substrate of the active matrix type liquid crystal panel (Example 1)
Figure 29B:
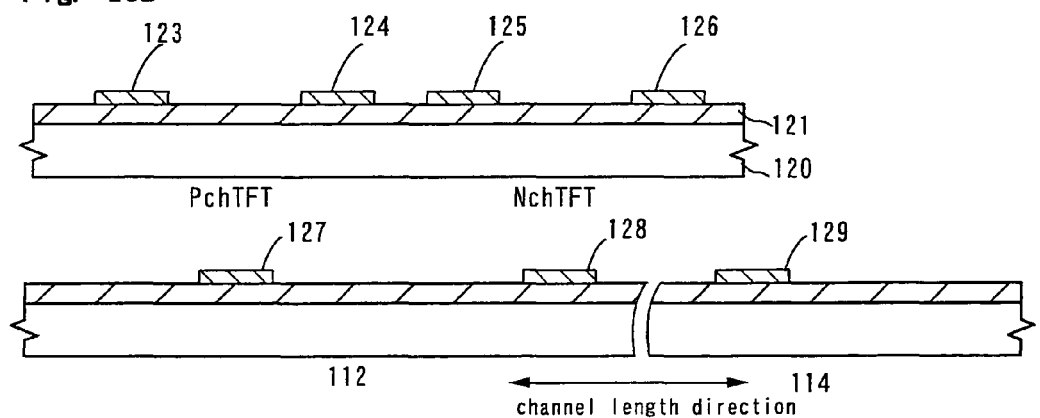

Refer to FIG. 29A

1737 glass of Corning Corporation is prepared as a substrate 120. As the substrate 120, a substrate comprising glass of barium boro-silicate glass or aluminum boro-silicate glass or a quartz substrate may be used.

As a base film 121, a silicon oxynitride film ($SiO_xN_y$) is formed with a thickness of 100 nm from a raw material gas comprising silane ($SiH_4$) and dinitrogen monoxide ($N_2O$) in a plasma CVD apparatus. The thickness of the base film 121 is about 20 through 200 nm.

There is formed a film whose major component is silicon including amorphous germanium (hereinafter, described as $SiGe_x$ film) in close contact with the base film 121 in the plasma CVD apparatus. As a raw material gas, germane ($GeH_4$) diluted to 10% by silane ($SiH_4$) and hydrogen gas ($H_2$) is used. A flow rate of $SiH_4$ is 90 sccm and that of diluted $GeH_4$ is set to 10 sccm. High frequency power is 0.35 W/cm² (27 MHz), modulated to pulse discharge having a repeating frequency of 5 kHz (duty ratio 20%) and supplied to a cathode of a parallel plane type plasma CVD apparatus.

A thickness of the amorphous $SiGe_x$ film is set to 55 nm.

An entire surface of the amorphous $SiGe_x$ film is coated with a nickel acetate solution having a concentration of 10 ppm by using a spinner and subjected to a heating treatment to crystallize in a heating furnace. Further, the amorphous $SiGe_x$ film is subjected to a heating treatment for 1 hour at 500° C. and heated for four hours at 580° C. to crystallize to thereby form a crystalline $SiGe_x$ film. A crystalline semiconductor having 20% or more of an orientation rate of {101} is formed. (Refer to FIG. 29B)

A resist mask is formed by a photolithography method on the crystallized $SiGe_x$ film and the crystalline silicon film is etched by using the mask to thereby form first crystalline semiconductor layers 123 through 129 having desired shapes.

The first crystalline semiconductor layers 123 and 124 of CMOSTET are layers for constituting a source region and a drain region of a P-channel type TFT (hereinafter, referred to as PchTFT). The first crystalline semiconductor layers 125 and 126 are layers for constituting a source region and a drain region of an N-channel type TFT (hereinafter, referred to as NchTFT).

Refer to FIG. 28

In the pixel portion, the first crystalline semiconductor layers 127 and 128 are layers for constituting the source region and the drain region of the pixel TFT (NchTFT). The first crystalline semiconductor layer 129 is a layer for forming the capacitor 114 and a layer constituting a portion connected to the pixel electrode 115.

Figure 29C:
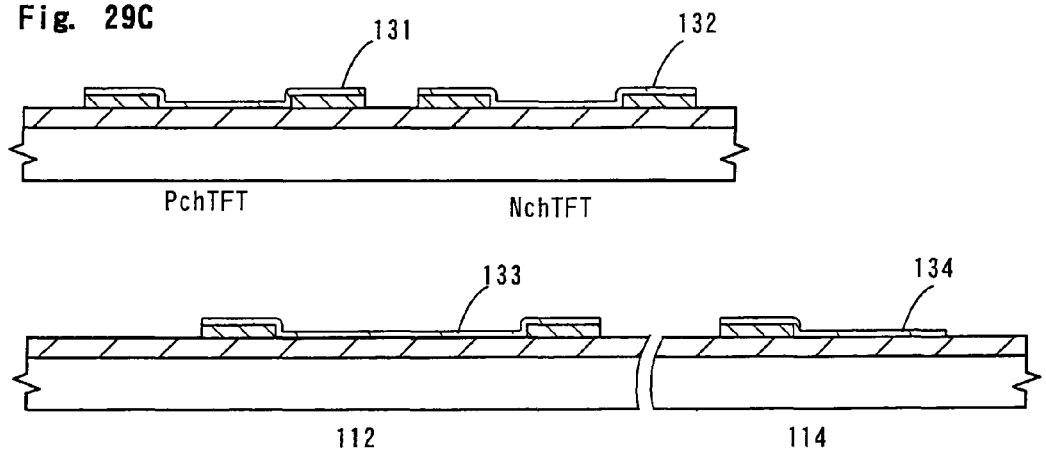

Refer to FIG. 29C

Next, an amorphous silicon film is formed to a thickness of 250 nm by constituting raw material gas by silane ($SiH_4$) in the plasma CVD apparatus in close contact with the first crystalline semiconductor layers 123 through 129. A resist mask is formed by a photolithography method and the amorphous silicon film is etched by using the mask to thereby form second amorphous semiconductor layers 131 through 134 having desired shapes.

Figure 30A:
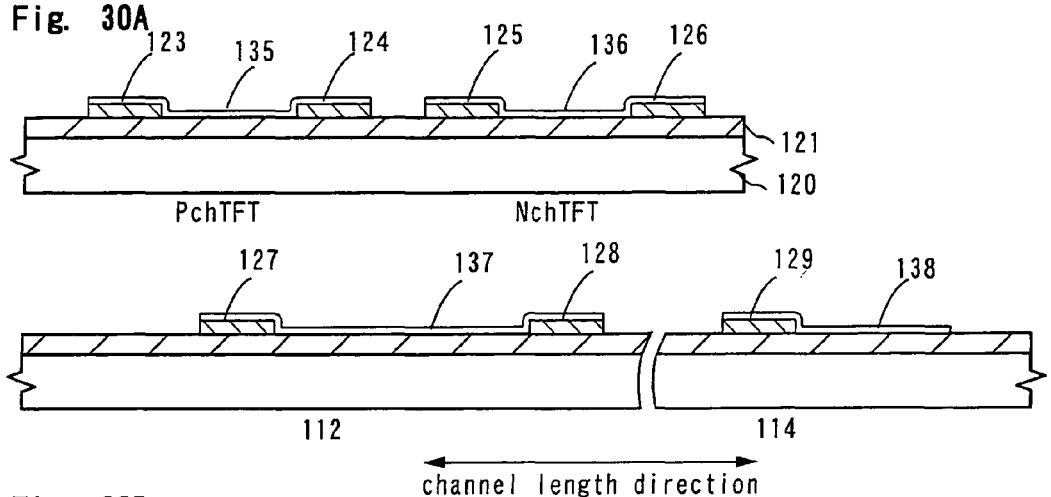
FIGS. 30A, 30B and 30C are sectional views continued from FIG. 29C showing the method of fabricating the TFT array substrate of the active matrix type liquid crystal panel (Example 1)

Refer to FIG. 30A

The second semiconductor layers 131 through 134 are crystallized by irradiating continuous wave laser beam while scanning along the channel length direction to thereby form second crystalline semiconductor layers 135 through 138.

In crystallization by continuous wave laser beam, as a continuous wave laser apparatus, an apparatus using a solid state laser using $YVO_4$ crystal doped with Nd is used. Further, irradiated laser beam is second harmonic (532 nm) of basic wave. A shape of the beam (sectional shape) is enlarged in a shape of a long ellipse having a long axis of 200 μm and a short axis of 20 μm. An output of the laser beam is set to 3 through 6 W (here, set to 5 W), moving speed of the substrate is set to 5 through 100 cm/sec (in this case, set to 50 cm/sec) and an environment of irradiating the laser beam is set to an atmospheric environment. Further, the continuous wave laser beam is irradiated while fixing the laser beam and moving the substrate such that an irradiated area is moved in the short axis direction of the beam. Further, the moving direction is set to the channel length direction of CMOSTET, pixel TFT 112 and capacitor 114.

By crystallization under the above-described conditions, according to the second crystalline semiconductor layers, a crystal grain boundary at a portion provided with the channel forming region is made parallel with the channel length direction such that a crystal boundary in the channel width direction cannot be formed.

Further, before crystallizing the second amorphous semiconductor layers, with a purpose of controlling threshold voltage of TFT, boron or gallium may be doped previously in the silicon film. As a timing of doping, the doping can be carried out while forming the amorphous silicon films and further, after forming the film, the doping can be carried out by ion doping apparatus. Doped boron or gallium is activated by the continuous wave laser beam irradiated for crystallizing the second amorphous semiconductor layers.

Figure 30B:
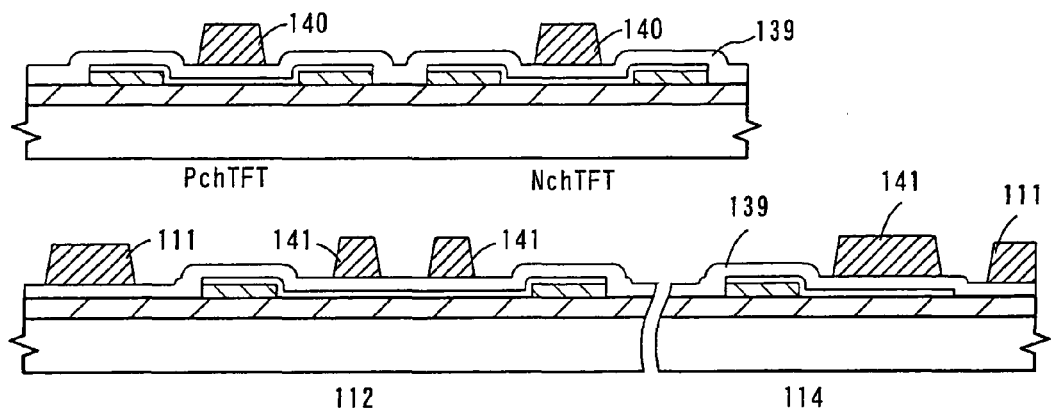

Refer to FIG. 30B

Next, an insulating film 139 is formed in close contact with the second crystalline semiconductor layers 135 through 138. The insulating film 139 functions as a gate insulating film of TFT and a dielectric of the capacitor. Here, as the insulating film 139, in the plasma CVD apparatus, a silicon oxynitride film ($SiO_xN_y$) is formed from a raw material gas by silane ($SiH_4$) and dinitrogen monoxide ($N_2O$) with a thickness of 110 nm.

Next, a conductive film is formed in close contact with the insulating film 139, a mask is formed of a resist by a photolithography method and by utilizing the mask, a gate electrode 140 of CMOSTET, the gate line 111 of the pixel portion and an electrode 141 are formed. As shown by FIG. 28, the electrode 141 is a gate electrode of pixel TFT and also is an electrode of the capacitor provided next to the pixel. Here, as the conductive film, a tungsten film (W film) is formed by a thickness of 300 nm in a sputtering apparatus. In an ICP (Inductively Coupled Plasma) etching apparatus, by a mixture gas of $CF_4$ and $Cl_2$ as an etching gas, the tungsten film is etched to thereby form the gate line 111 and the electrode 141.

Figure 30C:
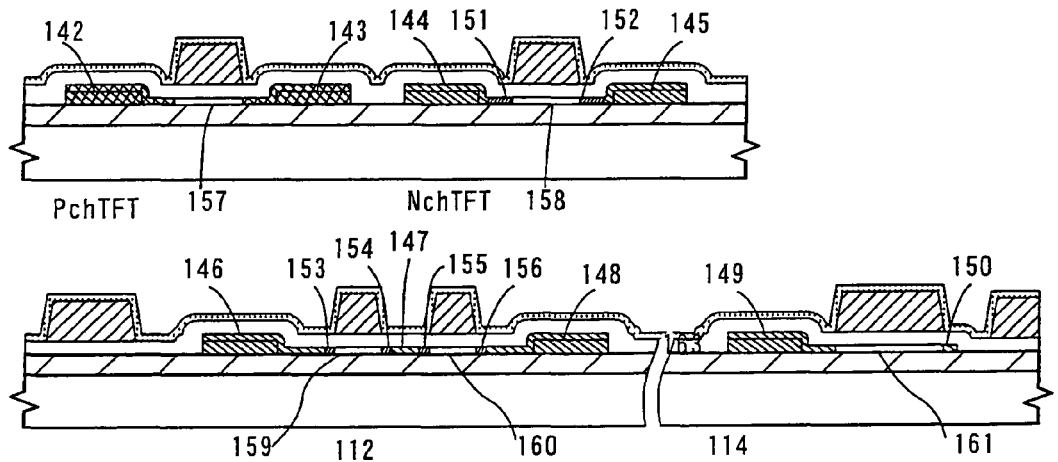

Refer to FIG. 30C

Next, doping is carried out in a plasma doping apparatus to thereby form impurity regions of N-type and P-type. Boron is doped as an impurity of P-type to the first crystalline semiconductor layers 123 and 124 and the second crystalline semiconductor layer 135 of PchTFT of the drive circuit to thereby form P+ regions 142 and 143 showing a conductivity of P-type. Further, phosphor is doped as an impurity of N-type to the first crystalline semiconductor layers 125 through 129 and the second crystalline semiconductor layers 136 through 138 of NchTFT, the pixel TFT and the capacitor of the drive circuit to thereby form N+ regions 144 through 150 and N− regions 151 through 156 showing a conductivity of N-type. Further, the N− region is a region having a concentration of phosphor lower than that of the N+ region and resistance higher than that of the N+ region.

The P+ regions 142 and 143 are formed in a self alignment manner with the gate electrode 140 as a mask. Further, the N+ regions 144 through 147 are formed in a non-self alignment manner by using a resist mask, the N+ regions 148 and 149 are formed in a self alignment manner by using the electrode 141 and the N-regions 150 through 155 are formed in a self alignment manner by using the electrode 141. Further, by forming the impurity regions, the channel forming region 157 through 161 are defined.

The capacitor 114 is finished by the step. The capacitor 114 is constructed by a constitution constituting an electrode pair by a channel induced at a channel forming region 161 by an electric field produced by the electrode 141 and a dielectric by formed from insulating film 139.

Figure 31A:
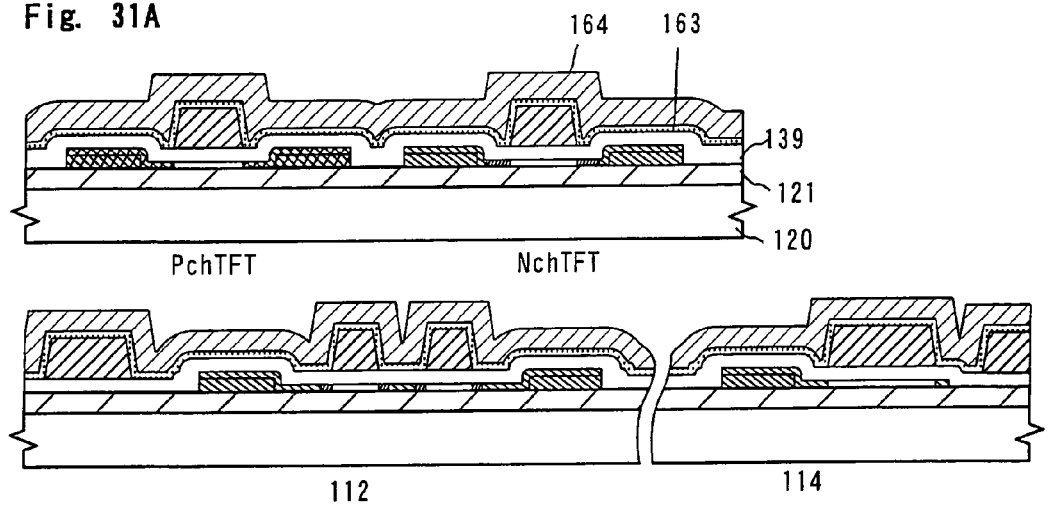
FIGS. 31A and 31B are sectional views continued from FIG. 30C showing the method of fabricating the TFT array substrate of the active matrix type liquid crystal panel (Example 1)

Refer to FIG. 31A

Next, an insulating film 163 is formed over an entire surface of the substrate. The insulating film is a first layer of an interlayer insulating film and also is a protective film for preventing the gate line 110 and the like from being oxidized in heat treatment for activating the impurity regions. In this case, as the insulating film 163, a silicon oxynitride film is formed by a thickness of 50 nm in the plasma CVD apparatus. According to the silicon oxynitride film, composition of O is larger than composition of N.

Next, by carrying out heat treatment at 550° C. in a nitrogen environment in a heating treatment apparatus, previously doped phosphor and boron are activated. Further, an insulating film 164 is formed over an entire surface of the substrate. The insulating film is a second layer of an interlayer insulating film and in this case, a silicon oxynitride film is formed by a thickness of 100 nm in the plasma CVD apparatus.

Figure 31B:
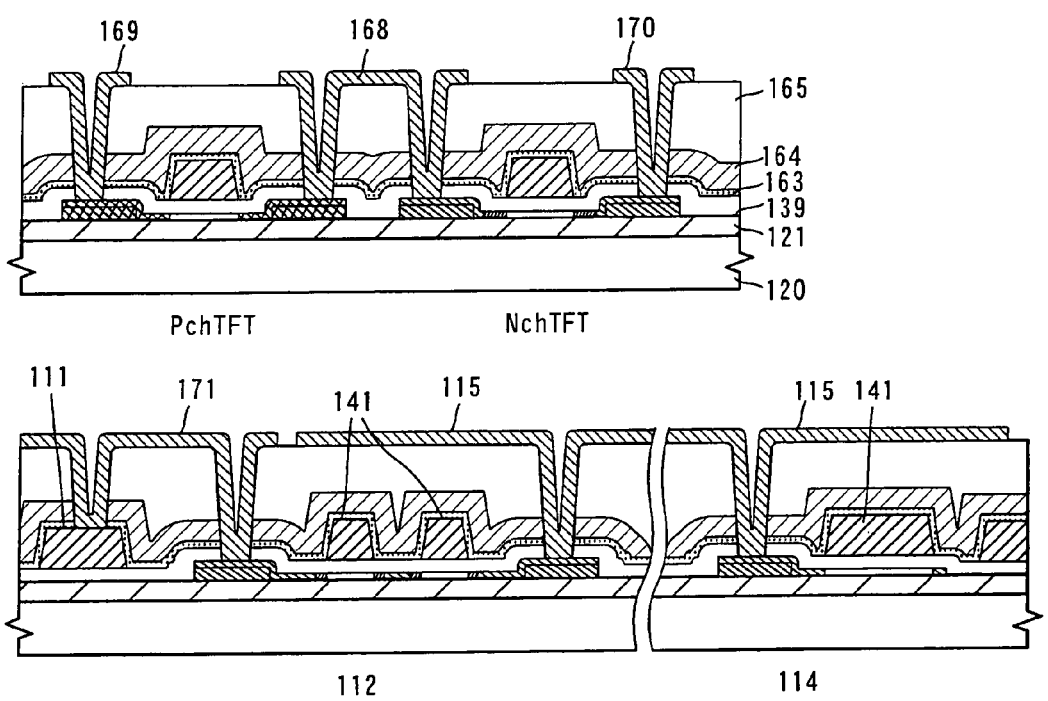

Refer to FIG. 31B

In order to flatten the surface of the substrate, a flattening film 165 is formed. For the flattening film 165, as an inorganic material, a silicon oxide film formed by using TEOS (Tetraethyl Ortho Silicate) as a raw material gas in the plasma CVD method or SOG, PSG, BSG formed by a coating method is applicable. Further, as an organic region material, polyimide, acrylic resin or BCB (benzocyclobutene) formed by a coating method is applicable. Flatness can be promoted in the case of a film capable of being formed by the coating method rather than a film formed by the CVD method. The flatness can further be promoted by forming the insulating film and polishing the surface of the film by a CMP method. In this case, as the flattening film 165, acrylic resin is formed on the gate electrode 141 by a coating method such that a thickness thereof becomes 1 μm. Further, contact holes are formed at predetermined positions of the insulating films 163 and 164 and the flattening film 165 (refer to FIG. 28).

In order to constitute the pixel electrode 115 by a reflection type electrode, there is formed a conductive film comprising a material excellent in reflectance such as a film whose major component is aluminum (Al) or Ag, a film comprising titanium (Ti) or a film laminated with these. In this case, an aluminum film is formed by a sputtering method. A resist mask is formed by a photolithography method, the aluminum film is etched by using the mask and an electrode 167 for connecting NchTFT and PchTFT, wirings 168 and 169 for constituting an input portion/an output portion of CMOSTFT, the gate signal line 110, the pixel electrode 115, and an electrode 170 for connecting the pixel TFT 112 and the source signal line 111, are formed. Further, although not illustrated in the sectional views, as shown by FIG. 28, the electrode 141 is connected to the gate signal line 110 via the contact hole. It is preferable to make the surface irregular by adding a step of a publicly-known sand blast method or etching method to prevent mirror reflection and scatter reflected light to thereby increase a white color degree.

By the above-described steps, the TFT array substrate fabricated with the pixel portion including the pixel TFT and the capacitor 114 and the drive circuits 104 and 105 including CMOSTET on the same substrate is finished.

Next, a liquid crystal panel is finished by preparing the opposed substrate and carrying out a publicly-known step of integrating a cell thereafter. Further, although according to the embodiment, TFT is fabricated based on the method explained in Embodiment 2, the method of other embodiment may naturally be adopted.

Embodiment 2

FIGS. 32, 33

According to the embodiment, an explanation will be given of an example of carrying out the invention in an active matrix type electroluminescence (EL) panel having a pixel portion and a drive circuit on the same substrate.

A TFT array substrate of an active matrix type EL Panel comprises an integrated circuit using TFTs in a pixel portion, a gate line drive circuit for transmitting a signal to a gate line of the pixel portion and a source line drive circuit for transmitting a signal to a source line thereof similar to a liquid crystal panel.

Figure 32:
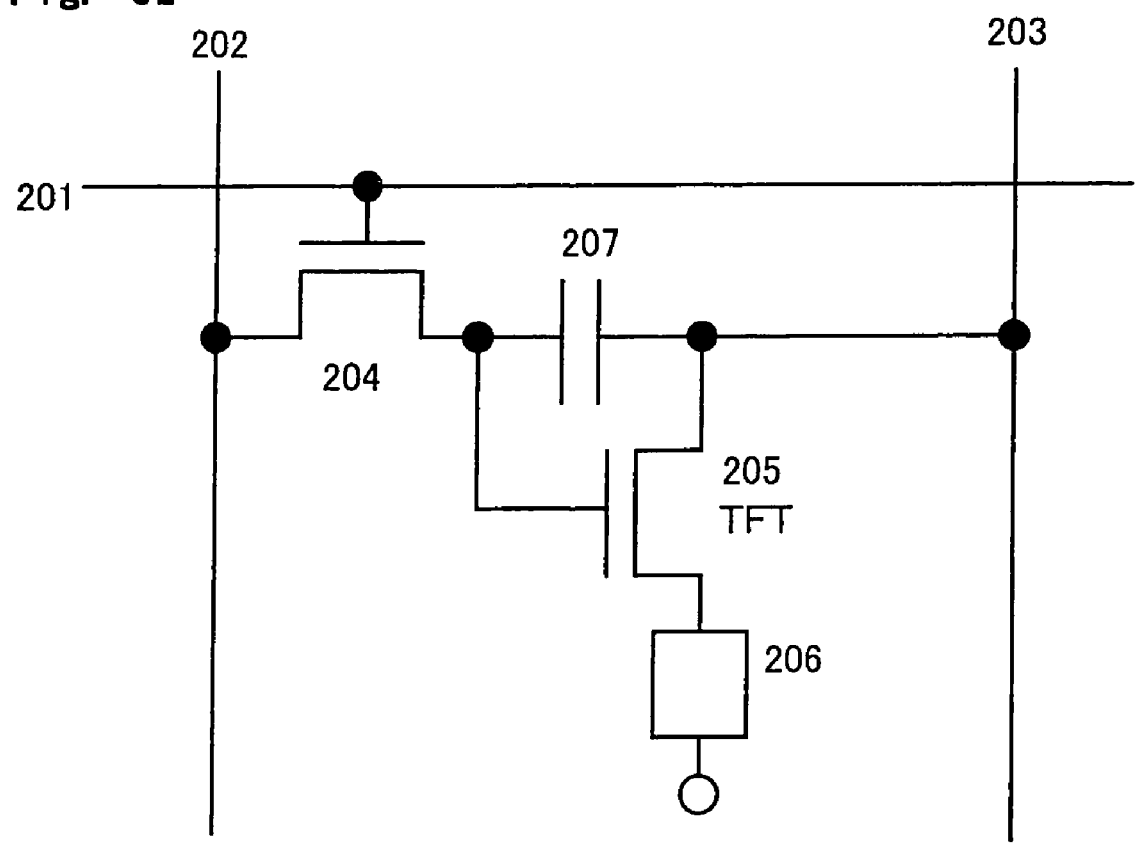
FIG. 32 is an equivalent circuit diagram of a pixel portion of a light emitting device utilizing electroluminescence (Example 2)

Refer to FIG. 32

FIG. 32 is a basic equivalent circuit diagram of a pixel. An intersected portion of a gate line 201 and a source line 202 is provided with a switching TFT 204, current controlling TFT 205, an EL element 206 and a capacitor 207. Further, a power source supply line 203 for supplying current to the EL element 206 is provided. The crystalline semiconductor layer of the invention is applied to TFTs of the drive circuit and the pixel portion.

The EL element 206 is a diode element which is a light emitting element supplied with current from the power source supply line via the current controlling TFT 205 for emitting light. The switching TFT 204 is for controlling a timing for bringing the current controlling TFT 205 into an ON state.

Figure 33A:
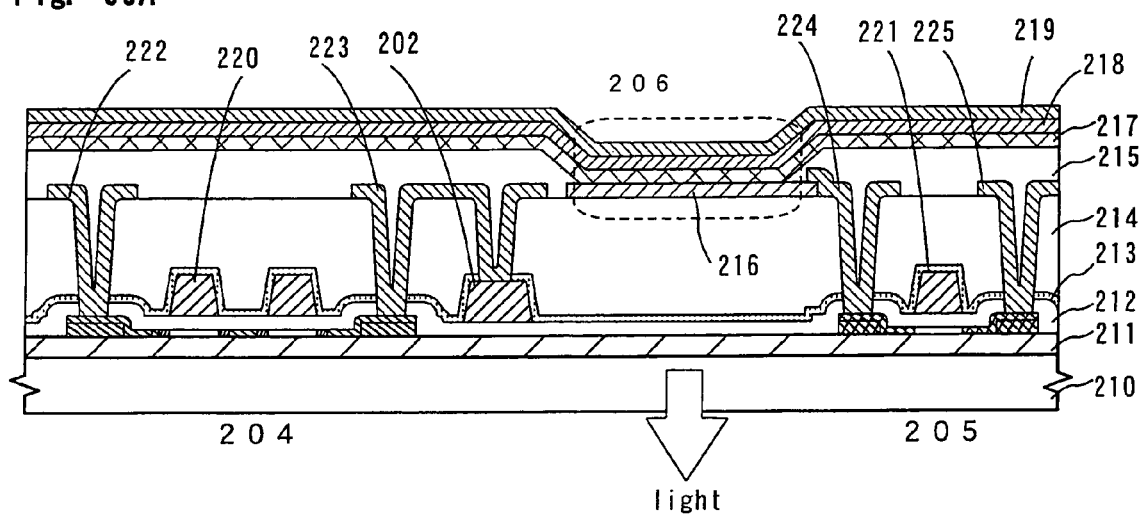
FIGS. 33A and 33B are sectional views showing the pixel portion of a light emitting device utilizing electroluminescence (Example 2)
Figure 33B:
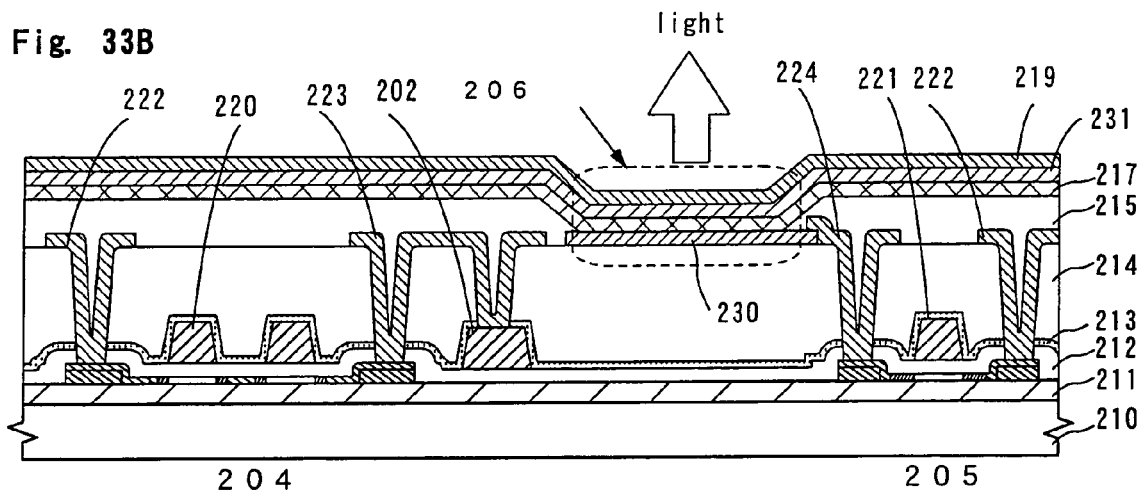

Refer to FIGS. 33A, 33B

FIGS. 33A and 33B are sectional views of the pixel portion, FIG. 33A shows a pixel of a bottom emitting type for emitting light from a bottom side of the EL element via a TFT substrate and FIG. 33B shows a pixel of a top emitting type for emitting light from a top side of the EL element without passing the TFT substrate.

Refer to FIG. 33A

The switching TFT 204 comprising NchTFT and the current controlling TFT 205 comprising PchTFT are provided over a substrate 210 via a base film 211. A drain of the current controlling TFT 205 is connected to an anode layer 216 of the EL element 206.

Constitutions of the switching TFT 204 and the current controlling TFT 205 and a structure comprising gate electrodes of 220 and 221 provided over an insulating film 212, a source wiring 202 and electrodes 222 through 224 provided over interlayer insulators 213 and 214, are similar to those of Embodiment 1. Although not illustrated, a capacitor 207 is provided similarly to Embodiment 1.

The EL element 206 comprises the anode layer 216, an organic compound layer 217 including a light emitting material, a cathode layer 218, and a passivation layer 219 is formed thereabove. A partition wall layer 215 is formed to cover an end portion of the anode layer 216.

As a material for forming the anode layer 216, a material having high work function such as indium oxide, tin oxide or zinc oxide is used and as a cathode, a material having low work function formed by an alkaline metal or an alkaline earth metal of MgAg, AlMg, Ca, Mg, Li, AlLi, AlLiAg or the like, and representatively, a magnesium compound is used.

The organic compound layer 217 includes a light emitting layer, a hole injecting layer, an electron injecting layer, a hole transporting layer and an electron transporting layer. Further, in luminescence of the organic compound, there are light emittance (fluorescence) in returning from a singlet excited state to a ground state and light emittance (phosphorescence) in returning from a triplet excited state to the ground state and light emittance of either or both of these is included.

As the passivation layer 219, a film of a material having high barrier performance against oxygen or steam such as silicon nitride, silicon oxynitride, diamond-like carbon (DLC) or the like is formed. By such a constitution, there is constructed a constitution in which light emitted from the EL element 206 is emitted from the side of the anode layer 216.

Refer to FIG. 33B

Meanwhile, the pixel portion of FIG. 33B is similar to that of FIG. 33A and differs therefrom in that the current controlling TFT205 is NchTFT and the cathode and the anode of the EL element 206 are switched. An electrode 230 connected to the electrode 224 of the current controlling TFT 205 is the cathode and numeral 231 designates an anode layer.

The active matrix type EL panel can be fabricated as described above. Further, the circuit of the pixel portion is not limited to the circuit shown in FIG. 32 but various circuits can be designed in accordance with a driving method, in any of the cases, by forming TFT of the pixel portion by the crystalline semiconductor layer of the invention, a panel having small dispersion in brightness for respective pixel can be fabricated.

Embodiment 3

FIG. 34

The liquid crystal panel that is non-self luminous display device and the EL panel that is self luminous display device described in Embodiment 1 can be equipped as a display portion with various electronic apparatuses.

Given as examples of the electronic apparatus are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). Specific examples of the electronic apparatus are shown in FIGS. 34A to 34H.

Figure 34A:
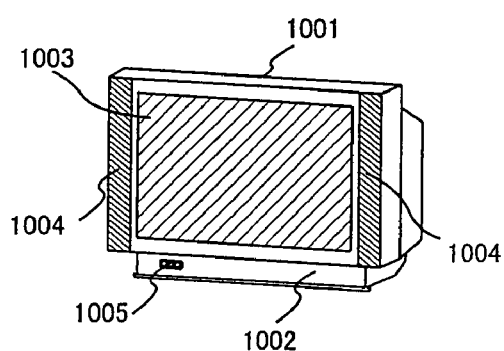
FIGS. 34A, 34B, 34C, 34D, 34E, 34F, 34G and 34H are views exemplifying electronic apparatus to which the invention is applied (Example 3)

Refer to FIG. 34A

The display device shown in FIG. 34A includes every display device for displaying information such as one for a personal computer, one for receiving TV broadcasting, and one for advertisement. The display device comprises a casing 1001, a supporting base 1002, a display portion 1003, speaker portions 1004, a video input terminal 1005, etc. The direct view type of the liquid crystal panel and the EL panel described in embodiments are equipped with the display device as a display portion 1003. The display device may also be a projection type in which displayed image on the liquid crystal panel and the EL panel by an optical system is projected on the display portion 1003 (screen).

In the present circumstances, the luminance of electroluminescence materials is low so that only the liquid crystal panel can be applied to the projection type. The time in the future when high luminance electroluminescence materials will be developed, projection type electroluminescence display device using the TFT array substrate of the present invention can be put to practical use.

Figure 34B:
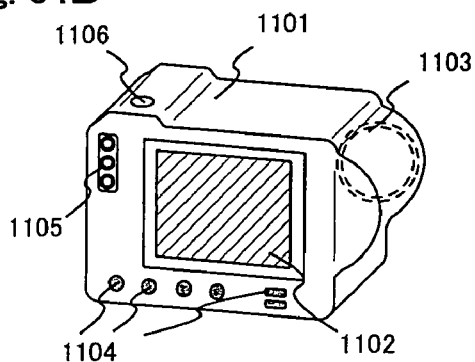

Refer to FIG. 34B

FIG. 34B shows a digital still camera, which comprises a main body 1101, a display portion 1102, an image receiving portion 1103, operation keys 1104, an external connection port 1105, a shutter 1106, etc. The liquid crystal panel and the EL panel described in embodiments are equipped with the digital still camera as the display portion 1102. The digital still camera has not only functions of recording and reproducing of still image but also functions of recording and reproducing of moving image.

Figure 34C:
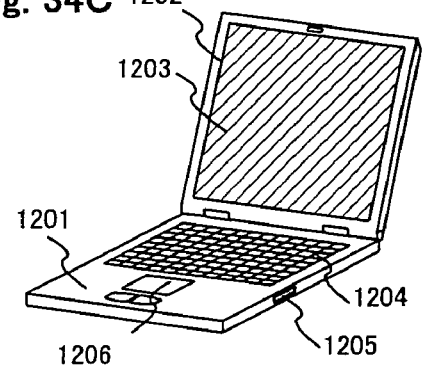

Refer to FIG. 34C

FIG. 34C shows a laptop computer, which comprises a main body 1201, a casing 1202, a display portion 1203, a keyboard 1204, an external connection port 1205, a pointing mouse 1206, etc. The liquid crystal panel and the EL panel described in embodiments are equipped with the laptop computer as the display portion 1203.

Figure 34D:
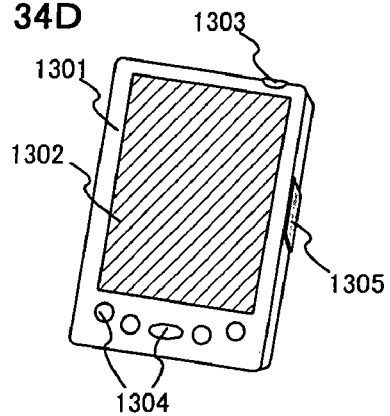

Refer to FIG. 34D

FIG. 34D shows a PDA, which comprises a main body 1301, a display portion 1302, a switch 1303, operation keys 1304, an infrared ray port 1305, etc. The liquid crystal panel and the EL panel described in embodiments are equipped with the PDA as the display portion 1302.

Figure 34E:
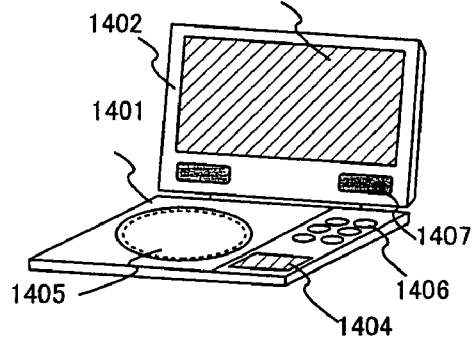

Refer to FIG. 34E

FIG. 34E shows a portable image reproducing device equipped with a recording medium (a DVD player, to be specific). The device comprises a main body 1401, a casing 1402, a display portion 1403, a display portion 1404, a recording medium (DVD or the like) reading portion 1405, operation keys 1406, speaker portions 1407, etc. The display portion 1403 mainly displays image information recorded in the recording medium. The display portion 1404 mainly displays text and symbol information such as a title of the image information and an operation method recorded in the recording medium. The liquid crystal panel and the EL panel described in embodiments are equipped with the portable image reproducing device as the display portions 1403 and 1404.

Figure 34F:
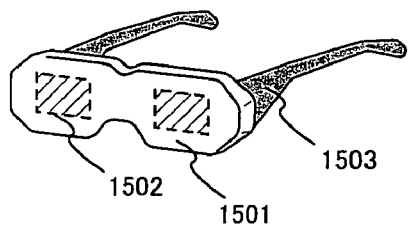

Refer to FIG. 34F

FIG. 34F shows a goggle type display, which comprises a main body 1501, display portions 1502, and arm portions 1503. The liquid crystal panel and the EL panel described in embodiments are equipped with the goggle type display as the display portion 1502. Although illustrated display device is a goggle type mount type display device, it is obviously that the display device can be applied to a head mount type display device.

The display device includes two types of display devices; the direct view type that the liquid crystal panel or the EL panel is viewed directly and formed by the panel having less than 1 inch in diagonal diameter, and the projection type that the displayed image on the microscopic panel is projected by an optical system that is built in the main body 1501.

Figure 34G:
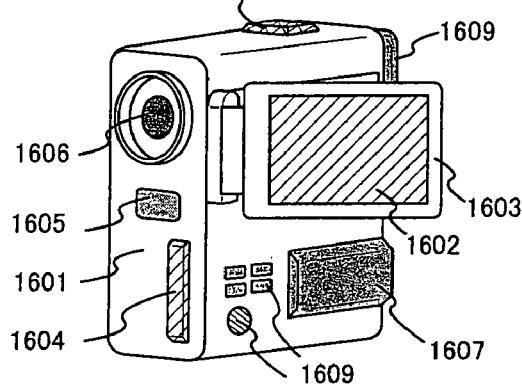

Refer to FIG. 34G

FIG. 34G shows a video camera, which comprises a main body 1601, a display portion 1602, a casing 1603, an external connection port 1604, a remote control receiving portion 1605, an image receiving portion 1606, a battery 1607, an audio input portion 1608, operation keys 1609, an eyepiece portion 1610 etc. The liquid crystal panel and the EL panel described in embodiments are equipped with the video camera as the display portion 1602.

Figure 34H:
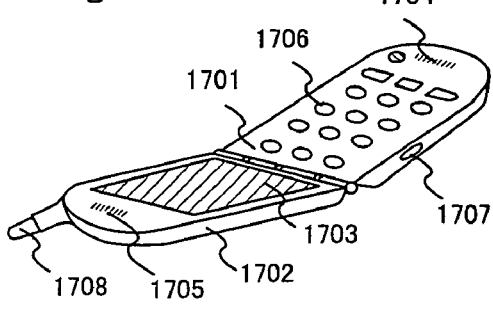

Refer to FIG. 34H

FIG. 34H shows a cellular phone, which comprises a main body 1701, a casing 1702, a display portion 1703, an audio input portion 1704, an audio output portion 1705, operation keys 1706, an external connection port 1707, an antenna 1708, etc. The liquid crystal panel and the EL panel described in embodiments are equipped with the cellular phone as the display portion 1703.

As described above, the application range of the active matrix type display panel to which the TFT of the present invention is applied is very wide and electronic apparatuses of every field can employ the device. It is noted that the electronic apparatuses illustrated in FIG. 34 are merely some examples, and that does not limit the usage.

According to the invention, in the crystalline semiconductor layer for constituting a channel of a semiconductor element such as a thin film transistor or a diode, crystals grow in a horizontal direction of a substrate (grow laterally) by constituting a seed by a lower layer of a crystalline semiconductor layer and therefore, a grain boundary of a crystal grain of a semiconductor can be controlled to be parallel with a channel length direction in the channel.

Further, a crystal orientation of the lower layer of the crystalline semiconductor layer constituting the seed is aligned and therefore, in the channel, the crystal orientation of the crystal grain of the semiconductor can be aligned with respect to the channel length direction.

Therefore, the position of the grain boundary of the crystal grain and the crystal orientation of the crystal grain of the channel can be controlled as described above and therefore, a circuit integrated with a thin film transistor having a high field effect mobility by restraining a variation in characteristics of respective element can be fabricated.

Further, even when the film thickness of the upper layer of the crystalline semiconductor layer is thinned to be 20 through 40 nm, since there is present the lower layer of the crystalline semiconductor layer for constituting the seed and therefore, the crystals can be made to grow by aligning the position of the crystal grain boundary and the crystal orientation as described above. Therefore, the semiconductor layer of the channel can be thinned and therefore, leakage of current in an OFF state of the thin film transistor can be reduced and an ON current/OFF current ratio can be increased.

Further, process temperature of the crystallizing method according to the invention is temperature capable of utilizing a glass substrate. Accordingly, the thickness of the channel forming region can be made to be as thin as about 20 through 40 nm even when the film is not thinned by utilizing thermal oxidation as in the conventional example.

Further, even when the semiconductor layer of the channel is thinned to be 20 through 40 nm as described above, the contact resistance can be prevented from being increased by providing two layers of semiconductor layers of the lower layer of the first crystalline semiconductor layer and the upper layer of the second crystalline semiconductor layer at a portion thereof in contact with a wiring or an electrode and controlling the film thickness of the lower layer of the crystalline semiconductor layer.

What is claimed:

1. A semiconductor device comprising a thin film transistor comprising:

at least two first crystalline semiconductor layers; and
a second crystalline semiconductor layer provided on the at least two first crystalline semiconductor layers,
wherein a source region and a drain region of the thin film transistor are respectively provided in a portion in which the first and the second crystalline semiconductor layers are laminated;

wherein a channel forming region of the thin film transistor is provided in a portion in which the second crystalline semiconductor layer is not overlapped with the at least two first crystalline semiconductor layers, and wherein the channel forming region is provided with a highest orientation rate of {111} among crystal planes of {001}, {101} and {111}.

2. The semiconductor device according to claim 1,
wherein an orientation rate of crystal planes of the channel forming region of the second crystalline semiconductor layer is measured by an electron backscatter diffraction pattern.

3. The semiconductor device according to claim 1,
wherein a thickness of the second crystalline semiconductor layer falls in a range of 10 through 60 nm.

4. The semiconductor device according to claim 1,
wherein in the channel forming region of the second crystalline semiconductor layer, a crystal grain boundary is in parallel with a channel length direction.

5. The semiconductor device according to claim 1,
wherein the second crystalline semiconductor layer is thinner than the at least two first crystalline semiconductor layers.

6. An electronic apparatus comprising the semiconductor device according to claim 1,
wherein the semiconductor device is one of the group consisting of an active matrix type display panel, a video camera, a digital camera, a goggle type display, a head-mount type display, a navigation system, a sound reproducing apparatus, a personal computer, a game machine, a portable information terminal, a portable telephone, a portable game machine and an electronic book.

7. The semiconductor device according to claim 1,
wherein at least one edge of the at least two first crystalline semiconductor layers is aligned with an edge of the second crystalline semiconductor layer.

8. The semiconductor device according to claim 1,
wherein the semiconductor device further comprises a gate electrode comprising tungsten over the channel forming region with a gate insulating layer therebetween.

9. The semiconductor device according to claim 1,
wherein the thin film transistor has two channel forming regions including the channel forming region.

10. A semiconductor device comprising a thin film transistor comprising:
at least two first crystalline semiconductor layers including germanium; and
a second crystalline semiconductor layer provided on the at least two first crystalline semiconductor layers,
wherein a source region and a drain region of the thin film transistor are respectively provided in a portion in which the first and the second crystalline semiconductor layers are laminated;
wherein a channel forming region of the thin film transistor is provided in a portion in which the second crystalline semiconductor layer is not overlapped with the at least two first crystalline semiconductor layers, and
wherein an orientation rate of {101} is highest among crystal planes of {001}, {101} and {111} included in the channel forming region.

11. The semiconductor device according to claim 10,
wherein the orientation rate of crystal planes of the channel forming region of the second crystalline semiconductor layer is measured by an electron backscatter diffraction pattern.

12. The semiconductor device according to claim 10,
wherein a thickness of the second crystalline semiconductor layer falls in a range of 10 through 60 nm.

13. The semiconductor device according to claim 10,
wherein in the channel forming region of the second crystalline semiconductor layer, a crystal grain boundary is in parallel with a channel length direction.

14. The semiconductor device according to claim 10,
wherein the second crystalline semiconductor layer is thinner than the at least two first crystalline semiconductor layers.

15. An electronic apparatus comprising the semiconductor device according to claim 10,
wherein the semiconductor device is one of the group consisting of an active matrix type display panel, a video camera, a digital camera, a goggle type display, a head-mount type display, a navigation system, a sound reproducing apparatus, a personal computer, a game machine, a portable information terminal, a portable telephone, a portable game machine and an electronic book.

16. The semiconductor device according to claim 10,
wherein at least one edge of the at least two first crystalline semiconductor layers is aligned with an edge of the second crystalline semiconductor layer.

17. The semiconductor device according to claim 10,
wherein a content of germanium falls in a range of 1 atomic % through 10 atomic %.

18. The semiconductor device according to claim 10,
wherein the semiconductor device further comprises a gate electrode comprising tungsten over the channel forming region with a gate insulating layer therebetween.

19. The semiconductor device according to claim 10,
wherein the thin film transistor has two channel forming regions including the channel forming region.

20. A semiconductor device comprising:
at least one first crystalline semiconductor layer formed on an insulating surface;
a second crystalline semiconductor layer having at least a first portion and a second portion, wherein said first portion is formed on the first crystalline semiconductor layer and said second portion extends beyond a side edge of the at least one first crystalline semiconductor layer and is formed on said insulating surface;
a channel forming region of a thin film transistor formed in the second crystalline semiconductor layer;
an impurity region of the thin film transistor comprising said first crystalline semiconductor layer and said first portion of the second crystalline semiconductor layer,
wherein the channel forming region has a {111} crystal plane and an orientation rate of the {111} plane in the channel forming region is highest among {001}, {101} and {111} planes.

21. The semiconductor device according to claim 20,
wherein the orientation rate of crystal planes of the channel forming region of the second crystalline semiconductor layer is measured by an electron backscatter diffraction pattern.

22. The semiconductor device according to claim 20, wherein a thickness of the second crystalline semiconductor layer falls in a range of 10 through 60 nm.

23. The semiconductor device according to claim 20, wherein in the channel forming region of the second crystalline semiconductor layer, a crystal grain boundary is in parallel with a channel length direction.

24. The semiconductor device according to claim 20, wherein the second crystalline semiconductor layer is thinner than the first crystalline semiconductor layer.

25. An electronic apparatus comprising the semiconductor device according to claim 20, wherein the semiconductor device is one of the group consisting of an active matrix type display panel, a video camera, a digital camera, a goggle type display, a head-mount type display, a navigation system, a sound reproducing apparatus, a personal computer, a game machine, a portable information terminal, a portable telephone, a portable game machine and an electronic book.

26. The semiconductor device according to claim 20, wherein at least one edge of the first crystalline semiconductor layer is aligned with an edge of the second crystalline semiconductor layer.

27. The semiconductor device according to claim 20, wherein the semiconductor device further comprises a gate electrode comprising tungsten over the channel forming region with a gate insulating layer therebetween.

28. The semiconductor device according to claim 20, wherein the thin film transistor has two channel forming regions including the channel forming region.

* * * * *